US012588364B2

(12) United States Patent
Kim et al.

(10) Patent No.: US 12,588,364 B2
(45) Date of Patent: Mar. 24, 2026

(54) DISPLAY DEVICE AND METHOD FOR MANUFACTURING THE SAME

(71) Applicant: Samsung Display Co., Ltd., Yongin-Si (KR)

(72) Inventors: Jun Gi Kim, Hwaseong-si (KR); Jeong Won Kim, Hwaseong-si (KR); Tae Wook Kang, Seongnam-si (KR); Jong Hee Park, Hwaseong-si (KR); Hyun Eok Shin, Gwacheon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 823 days.

(21) Appl. No.: 17/715,377

(22) Filed: Apr. 7, 2022

(65) Prior Publication Data

US 2023/0048617 A1 Feb. 16, 2023

(30) Foreign Application Priority Data

Aug. 10, 2021 (KR) ........................ 10-2021-0104978

(51) Int. Cl.
H10K 59/122 (2023.01)
H10K 50/19 (2023.01)
(Continued)

(52) U.S. Cl.
CPC .......... H10K 59/122 (2023.02); H10K 50/19 (2023.02); H10K 50/80 (2023.02);
(Continued)

(58) Field of Classification Search
CPC .. H10K 50/80; H10K 59/1201; H10K 59/123; H10K 59/80518; H10K 71/00;
(Continued)

(56) References Cited

U.S. PATENT DOCUMENTS

| | | | |
|---|---|---|---|
| 8,420,423 | B2 | 4/2013 | Choi et al. |
| 10,050,098 | B2 | 8/2018 | Nam et al. |

(Continued)

FOREIGN PATENT DOCUMENTS

| | | |
|---|---|---|
| CN | 110890406 A | 3/2020 |
| KR | 10-2011-0109048 A | 10/2011 |

(Continued)

OTHER PUBLICATIONS

Machine translation of KR 10-2020-0031432 (Year: 2025).*

*Primary Examiner* — Britt Hanley
*Assistant Examiner* — Victor V Barzykin
(74) *Attorney, Agent, or Firm* — Innovation Counsel LLP

(57) ABSTRACT

A display device is provided. The display device comprises a substrate, at least one thin-film transistor disposed on the substrate, a planarization layer disposed on the thin-film transistor, a first metal layer disposed on the planarization layer and connected to the thin-film transistor, a first electrode disposed on the first metal layer, partitioning walls disposed on the planarization layer and spaced apart from the first electrode, wherein each of the partitioning walls includes a second metal layer and a first conductive layer, a pixel defining layer disposed on the first electrode and the partitioning walls, an organic layer disposed on the first electrode and the pixel defining layer, and a second electrode disposed on the organic layer, wherein the second metal layer is disposed under the first conductive layer and has an undercut beneath the first conductive layer, wherein at least portion of the organic layer is discontinuous between the partitioning walls.

20 Claims, 28 Drawing Sheets

(51) Int. Cl.

| | | |
|---|---|---|
| *H10K 50/80* | (2023.01) | |
| *H10K 59/12* | (2023.01) | |
| *H10K 59/123* | (2023.01) | |
| *H10K 59/124* | (2023.01) | |
| *H10K 59/80* | (2023.01) | |
| *H10K 71/00* | (2023.01) | |

(52) U.S. Cl.
    CPC ....... *H10K 59/1201* (2023.02); *H10K 59/123* (2023.02); *H10K 59/124* (2023.02); *H10K 59/80521* (2023.02); *H10K 59/80518* (2023.02); *H10K 71/00* (2023.02)

(58) Field of Classification Search
    CPC ................. H10K 50/19; H10K 59/124; H10K 59/80521; H10K 59/122
    See application file for complete search history.

(56)                References Cited

U.S. PATENT DOCUMENTS

| | | | |
|---|---|---|---|
| 10,504,985 | B2 | 12/2019 | Nam et al. |
| 2018/0122877 | A1* | 5/2018 | Beak .................. H10K 59/1216 |
| 2018/0212007 | A1 | 7/2018 | Lee et al. |

FOREIGN PATENT DOCUMENTS

| | | | |
|---|---|---|---|
| KR | 10-2017-0078175 | A | 7/2017 |
| KR | 10-2020-0031432 | A | 3/2020 |

* cited by examiner

FIG. 9

FIG. 15 ashing 222
215
213
211
210
MTL1
200
160
140
120
110

261 263 265
260

MTL2

170 130 150 180 208
TFT

OP

BR: 260, MTL2

DR3
DR1
DR2

DISPLAY DEVICE AND METHOD FOR MANUFACTURING THE SAME

CROSS-REFERENCE TO RELATED APPLICATION

This application claims priority from Korean Patent Application No. 10-2021-0104978 filed on Aug. 10, 2021 in the Korean Intellectual Property Office, and all the benefits accruing therefrom under 35 U.S.C. 119, the contents of which in its entirety are herein incorporated by reference.

BACKGROUND

Field

The present disclosure relates to a display device and a method for manufacturing the same.

Description of Related Art

Today, demand for display various types of devices for displaying images is increasing. For example, display devices are incorporated into various electronic devices such as smartphones, digital cameras, notebook computers, navigation systems, and smart televisions.

The display device may include a flat panel display device such as a liquid crystal display device (LCD), a field emission display device (FED), or a light-emitting display device. The light-emitting display device may include an organic light-emitting display device including an organic light-emitting element, an inorganic light-emitting display device including an inorganic light-emitting element such as an inorganic semiconductor, and a micro light-emitting display device including a micro light-emitting element.

The organic light-emitting element may include two opposing electrodes and a light-emitting layer interposed therebetween. The light-emitting layer receives electrons and holes from the two electrodes, which in turn recombine with each other therein to generate excitons. Then, the generated excitons change from an excited state to a ground state, such that light may be emitted.

The organic light-emitting display device including the organic light-emitting element does not require a light source such as a backlight unit, resulting in low power consumption, light weight, and thinness. Further, organic light-emitting display device has high quality characteristics such as a wide viewing angle, high luminance and contrast, and fast response speed. Thus, the organic light-emitting display device is attracting attention as a next-generation display device.

SUMMARY

A purpose of the present disclosure is to provide a display device in which leakage current is reduced to reduce low gray level color change and color mixing.

A purpose of the present disclosure is to provide a method for manufacturing a display device in which leakage current is reduced to reduce low gray level color change and color mixing.

Purposes according to the present disclosure are not limited to the above-mentioned purpose. Other purposes and advantages according to the present disclosure that are not mentioned may be understood based on following descriptions, and may be more clearly understood based on embodiments according to the present disclosure. Further, it will be easily understood that the purposes and advantages according to the present disclosure may be realized using means shown in the claims and combinations thereof.

According to an embodiment of the disclosure, the display device comprises a substrate, at least one thin-film transistor disposed on the substrate, a planarization layer disposed on the thin-film transistor, a first metal layer disposed on the planarization layer and connected to the thin-film transistor, a first electrode disposed on the first metal layer, partitioning walls disposed on the planarization layer and spaced apart from the first electrode, wherein each of the partitioning walls includes a second metal layer and a first conductive layer, a pixel defining layer disposed on the first electrode and the partitioning walls, an organic layer disposed on the first electrode and the pixel defining layer, and a second electrode disposed on the organic layer, wherein the second metal layer is disposed under the first conductive layer and has an undercut beneath the first conductive layer, wherein the organic layer is discontinuous between the partitioning walls.

In an embodiment, the partitioning walls are arranged to outline parts of the first electrode in a plan view.

In an embodiment, each of the partitioning walls extends parallel to at least one side of the first electrode, wherein each of the partitioning walls is longer than at least one side of the first electrode adjacent thereto.

In an embodiment, the first metal layer is connected to the thin-film transistor, wherein the first electrode is disposed directly on the first metal layer.

In an embodiment, the second metal layer is disposed directly on the planarization layer, and includes the same material as a material of the first metal layer.

In an embodiment, the first electrode includes a first lower layer, a first middle layer disposed on the first lower layer, and a first upper layer disposed on the first middle layer, wherein the first conductive layer includes a second lower layer, a second middle layer disposed on the second lower layer, and a second upper layer disposed on the second middle layer, wherein the first lower layer and the second lower layer are made of the same material, the first middle layer and the second middle layer are made of the same material, and the first upper layer and the second upper layer are made of the same material.

In an embodiment, each of the first lower layer, the first upper layer, the second lower layer and the second upper layer includes a transparent conductive material, and each of the first middle layer and the second middle layer includes a metal material.

In an embodiment, an etch rate of the first metal layer is higher than an etch rate of the first electrode for a preselected etching liquid, and wherein an etch rate of the second metal layer is higher than an etch rate of the first conductive layer relative to the preselected etching liquid.

In an embodiment, the organic layer includes at least a charge generation layer, wherein an undercut shape of each of the partitioning walls allows at least portion of the charge generation layer to be discontinuous between the partitioning walls.

In an embodiment, each of the organic layer and the second electrode vertically overlaps the first electrode, the pixel defining layer and the partitioning walls.

In an embodiment, the device further comprises an organic layer pattern disposed on the planarization layer and between the partitioning walls, and a second electrode pattern disposed on the organic layer pattern and between the partitioning walls.

In an embodiment, the first metal layer is disposed under the first electrode and has an undercut beneath the first electrode.

According to an embodiment of the disclosure, the display device comprises a substrate, at least one thin-film transistor disposed on the substrate, a planarization layer disposed on the thin-film transistor, a first metal layer disposed on the planarization layer and connected to the thin-film transistor, a first electrode disposed on the first metal layer, partitioning walls disposed on the planarization layer and spaced apart from the first electrode, wherein each of the partitioning walls includes a second metal layer and a first conductive layer, a pixel defining layer disposed on the first electrode and the partitioning walls, an organic layer disposed on the first electrode and the pixel defining layer, and a second electrode disposed on the organic layer, wherein the planarization layer has a groove defined therein, wherein the groove is disposed between the partitioning walls adjacent to each other, wherein the groove has an undercut portion beneath the second metal layer of each of the partitioning walls.

In an embodiment, the second metal layer is disposed under the first conductive layer and has an undercut beneath the first conductive layer, wherein at least a portion of the organic layer is discontinuous between the partitioning walls.

In an embodiment, the device further comprises an organic layer pattern disposed on the groove of the planarization layer, and a second electrode pattern disposed on the organic layer pattern.

According to an embodiment of the disclosure, the display device comprises a substrate, at least one thin-film transistor disposed on the substrate, a planarization layer disposed on the thin-film transistor, a first conductive pattern and a second conductive pattern disposed on the planarization layer, a protective layer disposed on the first conductive pattern and the second conductive pattern, a first metal layer disposed on the protective layer and connected to the thin-film transistor via the first conductive pattern, a first electrode disposed on the first metal layer, partitioning walls disposed on the protective layer, wherein each of the partitioning walls includes a second metal layer and a first conductive layer, a pixel defining layer disposed on the first electrode and the partitioning walls, an organic layer disposed on the first electrode and the pixel defining layer, and a second electrode disposed on the organic layer, wherein the protective layer has a groove defined therein, wherein the groove is disposed between the partitioning walls adjacent to each other, wherein the groove has an undercut portion beneath the second metal layer of each of the partitioning walls, wherein the groove vertically overlaps the second conductive pattern.

In an embodiment, the groove exposes at least a portion of the second conductive pattern, wherein the second metal layer of each of the partitioning walls is disposed under the first conductive layer and has an undercut beneath the first conductive layer.

In an embodiment, the device further comprises an organic layer pattern disposed on the second conductive pattern, and a second electrode pattern disposed on the organic layer pattern.

In an embodiment, at least portion of each of the organic layer and the second electrode is discontinuous between the partitioning walls, wherein the organic layer pattern and the organic layer include the same material, and wherein the second electrode and the second electrode pattern include the same material.

According to an embodiment of the disclosure, a method for manufacturing a display device, the method comprises forming a thin-film transistor on a substrate, forming a planarization layer on the thin-film transistor, sequentially stacking a metal layer material layer, a lower layer material layer, a middle layer material layer, and an upper layer material layer in this order on the planarization layer, etching the metal layer material layer, the lower layer material layer, the middle layer material layer, and the upper layer material layer to form a first metal layer and a first electrode disposed on the first metal layer, and to form partitioning walls, wherein each of the partitioning walls includes the second metal layer, and a first conductive layer disposed on the second metal layer, forming a pixel defining layer on the first electrode and the partitioning walls, forming an organic layer on the first electrode and the pixel defining layer, and forming a second electrode on the organic layer, wherein the second metal layer has an undercut beneath the first conductive layer, wherein at least a portion of the organic layer is discontinuous between the partitioning walls.

In an embodiment, etching the metal layer material layer, the lower layer material layer, the middle layer material layer, and the upper layer material layer includes performing first etching of the metal layer material layer, the lower layer material layer, the middle layer material layer, and the upper layer material layer to form the first metal layer and the first electrode disposed on the first metal layer and to form a partitioning wall pattern spaced apart from the first metal layer, forming a photoresist pattern so as to cover the first electrode and portions of the partitioning wall pattern, and performing second etching of the partitioning wall pattern using the photoresist pattern to form the partitioning walls.

In an embodiment, forming the pixel defining layer includes forming a pixel defining layer material layer so as to cover the first electrode and the partitioning walls, exposing a portion of the first electrode and a portion of the planarization layer between the partitioning walls using a photolithography process, and removing the pixel defining layer material layer remaining between the partitioning walls.

In an embodiment, removing the pixel defining layer material layer is performed using ashing or a dry etching process using a hard mask layer.

In an embodiment, etching the metal layer material layer, the lower layer material layer, the middle layer material layer, and the upper layer material layer includes batch-etching the metal layer material layer, the lower layer material layer, the middle layer material layer, and the upper layer material layer to form the first metal layer and the first electrode disposed on the first metal layer, and to form the partitioning walls.

In the display device and the method for manufacturing the same according to the embodiments, the charge generation layer is not continuously formed across the light-emitting areas, thereby reducing leakage current and thus reducing color mixing and improving gray level displaying.

Effects of the present disclosure are not limited to the above-mentioned effects, and other effects as not mentioned will be clearly understood by those skilled in the art from following descriptions.

BRIEF DESCRIPTION OF DRAWINGS

The above and other aspects and features of the present disclosure will become more apparent by describing in detail embodiments thereof with reference to the attached drawings, in which:

FIG. 9 is a cross-sectional view taken along a line Q3-Q3' in FIG. 8;

FIG. 12 to FIG. 19 are cross-sectional views showing steps of a method for manufacturing a display device according to an embodiment;

DETAILED DESCRIPTIONS

The inventive concept will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art.

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the present invention. Similarly, the second element could also be termed the first element.

Each of the features of the various embodiments of the present disclosure may be combined or combined with each other, in part or in whole, and technically various interlocking and driving are possible. Each embodiment may be implemented independently of each other or may be implemented together in an association.

Hereinafter, specific embodiments will be described with reference to the accompanying drawings.

Figure 1:
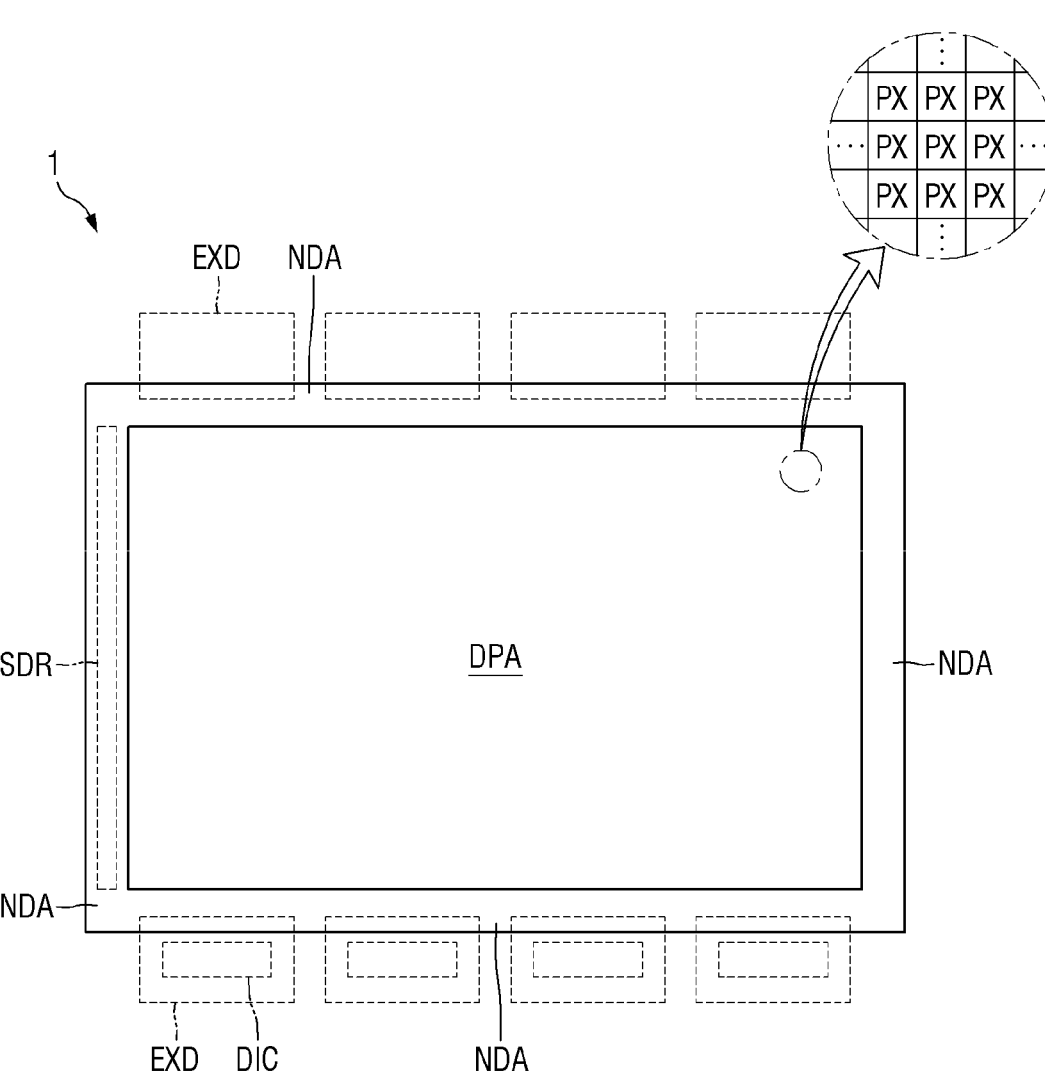
FIG. 1 is a plan view of a display device according to an embodiment.

FIG. 1 is a plan view of a display device according to one embodiment.

Referring to FIG. 1, a display device 1 according to one embodiment may be applied to a smartphone, a mobile phone, a tablet PC, a PDA (Personal Digital Assistant), a PMP (Portable Multimedia Player), a television, a game console, a wrist watch type electronic device, a head mounted display, a personal computer monitor, a notebook computer, a vehicle navigation system, a vehicle dashboard, a digital camera, a camcorder, an outdoor billboard, an electronic billboard, a medical device, an inspection device, various home appliances such as a refrigerator and a washing machine, or an Internet of Things (IoT) device. In the present disclosure, one example in which the display device is applied to the television is described. The television may have high to ultra-high resolutions such as HD, UHD, 4K, and 8K. The present disclosure is not limited thereto.

Further, the display device 1 according to one embodiment may be classified based on a display scheme. For example, the display device may include an organic light-emitting display device (OLED), an inorganic light-emitting display device (inorganic EL), a quantum dot light-emitting display device (QED), a micro LED display device (micro-LED), a nano LED display device (nano-LED), a plasma display device (PDP), a field emission display device (FED), a cathode-my tube (CRT), a liquid crystal display device (LCD), an electrophoretic display device (EPD), and the like. Hereinafter, a case in which the display device is embodied as the organic light-emitting display device (OLED) will be described by way of example. Unless special distinction is required, the organic light-emitting display device applied to an embodiment will be simply abbreviated as the display device. However, the embodiment is not limited to the organic light-emitting display device. When the same technical idea is applicable to other display devices, the present disclosure may also be applied to the other display devices.

The display device 1 according to one embodiment may have a rectangular shape in a plan view and, for example, may have a square shape. Further, when the display device 1 is applied to a television, a planar shape thereof may have a rectangular shape having a long side extending in the horizontal or longitudinal direction. However, the present disclosure is not limited thereto. The long side may extend in the vertical or transverse direction. Alternatively, the display device 1 may be rotatable so that an extension direction of the long side may change to the horizontal or vertical direction.

The display device 1 may include a display area DPA and a non-display area NDA. The display area DPA may refer to an active area in which an image is displayed. The display area DPA may have a rectangular shape in a plan view similar to the planar shape of the display device 1. The present disclosure is not limited thereto.

The display area DPA may include a plurality of pixels PX. The plurality of pixels PX may be arranged in a matrix form. A shape of each pixel PX may be a rectangular or regular square shape in a plan view, but may not be limited thereto. A shape of each pixel PX may have a rhombus shape having each side which is inclined with respect to one side of the display device 10. The plurality of pixels PX may render various colors. For example, the plurality of pixels PX may include, but may not be limited to, a first color pixel PX for rendering a red color, a second color pixel PX for rendering a green color, and a third color pixel PX for rendering a blue color. The pixels PX may be arranged in a stripe type manner or in a pentile™ type manner.

The non-display area NDA may be disposed around the display area DPA. The non-display area NDA may entirely or partially surround the display area DPA. The display area DPA may have a rectangular shape, while the non-display area NDA may have four portions, each adjacent to each of four sides of the display area DPA. The non-display area NDA may constitute a bezel of the display device 1.

A driver circuit or a driver element for driving the display area DPA may be disposed in the non-display area NDA. In one embodiment, in each of a first non-display area NDA disposed adjacent to a first long side (a lower side in FIG. 1) of the display device 1 and a second non-display area NDA disposed adjacent to a second long side (an upper side in FIG. 1) of the display device 10, a pad area may be disposed on a display substrate of the display device 1, and an external device EXD may be mounted on a pad electrode of the pad area. Examples of the external device EXD may include a connection film, a printed circuit board, a driver chip (DIC), a connector, and a line connection film. In a third non-display area NDA disposed adjacent to a first short side (a left side in FIG. 1) of the display device 1, a scan driver SDR, etc. formed directly on the display substrate of the display device 1 may be disposed.

Figure 2:
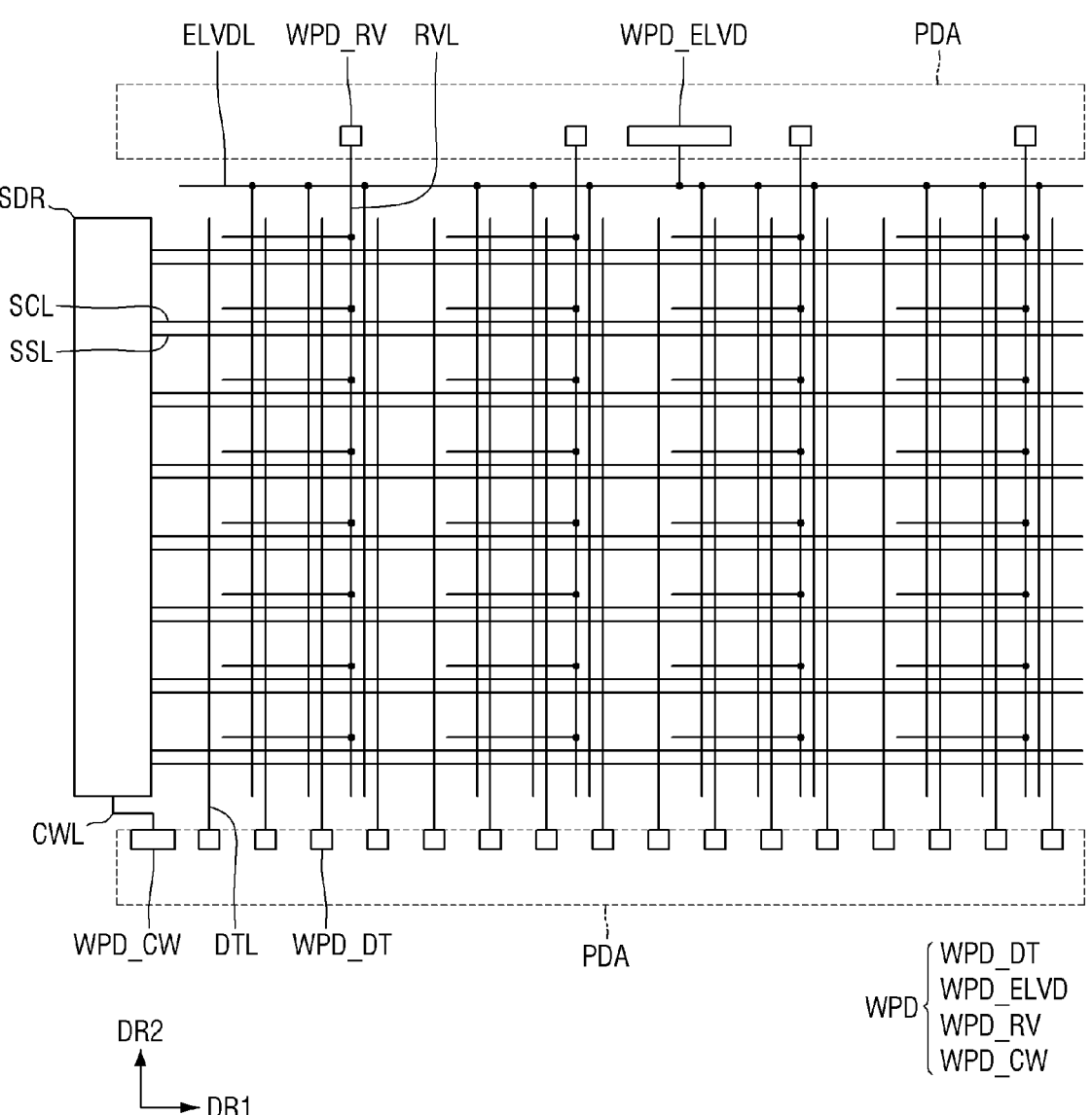
FIG. 2 is a schematic layout diagram of a circuit of a first substrate of a display device according to an embodiment.

FIG. 2 is a schematic layout diagram of a circuit of a first substrate of a display device according to one embodiment.

Referring to FIG. 2, a plurality of lines may be disposed on the first substrate. The plurality of lines may include a scan line SL, a sensing signal line SSL, a data line DTL, a reference voltage line RVL, a first power line ELVDL, and the like.

Each of the scan line SL and the sensing signal line SSL may extend in the first direction DR1. Each of the scan line SL and the sensing signal line SSL may be connected to the scan driver SDR. The scan driver SDR may include a driver circuit. The scan driver SDR may be disposed in the third non-display area NDA and on the first substrate. However, the disclosure is not limited thereto. The scan driver SDR may be disposed in a fourth non-display area NDA or in each of the third and fourth non-display areas NDA. The scan driver SDR may be connected to the signal connection line CWL. At least one end of the signal connection line CWL may be connected to a pad WPD_CW on a first non-display area NDA and/or a second non-display area NDA. The pad WPD_CW may be connected to the external device (EXD in FIG. 1).

Each of the data line DTL and the reference voltage line RVL may extend in the second direction DR2 intersecting the first direction DR1. The first power line ELVDL may include a portion extending in the second direction DR2. The first power line ELVDL may further include a portion extending in the first direction DR1. Thus, the first power line ELVDL may have a mesh structure. The present disclosure is not limited thereto.

A wire pad WPD may be disposed at and connected to at least one end of each of the data line DTL, the reference voltage line RVL, and the first power line ELVDL. The wire pads WPD may be disposed in the pad area PDA of the non-display area NDA. In one embodiment, a wire pad WPD_DT (hereinafter referred to as 'data pad' connected to the data line DTL may be disposed in the pad area PDA in the first non-display area NDA. A wire pad WPD_RV (hereinafter, "reference voltage pad" connected to the reference voltage line RVL, and a wire pad WPD_ELVD (hereinafter, referred to as 'first power pad' ' pad' connected to the first power line ELVDL) may be disposed in the pad area PDA of the second non-display area NDA. In another example, all of the data pad WPD_DT, the reference voltage pad WPD_RV, and the first power pad WPD_ELVD may be disposed in the same area, for example, in the first non-display area NDA. As described above, the external device (EXD in FIG. 1) may be mounted on the wire pad WPD. The external device EXD may be mounted on the wire pad WPD via an anisotropic conductive film or an ultrasonic bonding.

Each pixel PX on the first substrate includes a pixel driver circuit. The above-described lines may pass through or around each pixel PX and may apply a driving signal to each pixel driver circuit. The pixel driver circuit may include a transistor and a capacitor. Each of the number of transistors and the number of capacitors in each pixel driver circuit may be variously modified. Hereinafter, a 3T1C structure in which each pixel driver circuit includes three transistors and one capacitor will be described by way of example. The present disclosure is not limited thereto. Various modified pixel PX structures such as a 2T1C structure, a 7T1C structure, and a 6T1C structure may be applied to the disclosure.

Figure 3:
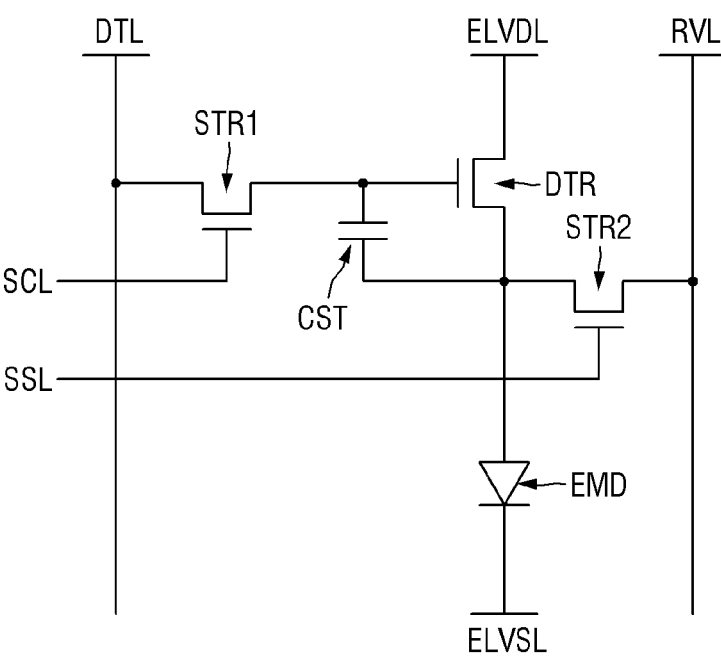
FIG. 3 is an equivalent circuit diagram of one pixel of a display device according to an embodiment.

FIG. 3 is an equivalent circuit diagram of one pixel of a display device according to one embodiment.

Referring to FIG. 3, each pixel PX of the display device according to one embodiment includes not only a light-emitting element EMD, but also three transistors DTR, STR1, and STR2, and one capacitor CST as a storage capacitor.

The light-emitting element EMD emits light based on current from a driving transistor DTR. The light-emitting element EMD may be implemented as an organic light-emitting diode, a micro light-emitting diode, a nano light-emitting diode, or the like.

A first electrode, that is, an anode of the light-emitting element EMD may be connected to a source electrode of the driving transistor DTR, while a second electrode, that is, a cathode thereof may be connected to a second power line ELVSL to which a low-potential voltage (second power voltage) lower than a high-potential voltage (first power voltage) of the first power line ELVDL is supplied.

The driving transistor DTR adjusts current flowing from the first power line ELVDL to which the first power voltage is supplied to the light-emitting element EMD, based on a voltage difference between a voltage of the gate electrode and a voltage of the source electrode thereof. The gate electrode of the driving transistor DTR may be connected to a first source/drain electrode of a first switching transistor STR1, the source electrode thereof may be connected to the first source/drain electrode of the light-emitting element EMD, and a drain electrode thereof may be connected to the first power line ELVDL to which the first power voltage is applied.

The first switching transistor STR1 is turned on based on a scan signal of the scan line SL to connect the data line DTL to the gate electrode of the driving transistor DTR. A gate electrode of the first switching transistor STR1 may be connected to the scan line SCL, a first source/drain electrode thereof may be connected to the gate electrode of the driving transistor DTR, and a second source/drain electrode thereof may be connected to the data line DTL.

The second switching transistor STR2 is turned on based on a sensing signal of the sensing signal line SSL to connect a reference voltage line RVL to the source electrode of the driving transistor DTR. A gate electrode of the second switching transistor STR2 may be connected to the sensing signal line SSL, a first source/drain electrode thereof may be connected to the reference voltage line RVL, and a second source/drain electrode thereof may be connected to the source electrode of the driving transistor DTR.

In one embodiment, the first source/drain electrode of each of the first and second switching transistors STR1 and STR2 may act as a source electrode, while the second source/drain electrode thereof may act as a drain electrode. The present disclosure is not limited thereto. The first source/drain electrode of each of the first and second switching transistors STR1 and STR2 may act as a drain electrode, while the second source/drain electrode thereof may act as a source electrode.

The capacitor CST may be disposed between the gate electrode and the source electrode of the driving transistor DTR. The storage capacitor CST stores therein the difference voltage between the gate voltage and the source voltage of the driving transistor DTR.

Each of the driving transistor DTR and the first and second switching transistors STR1 and STR2 may be embodied as a thin-film transistor. Further, in FIG. 3, an example in which each of the driving transistor DTR and the first and second switching transistors STR1 and STR2 is embodied as an N-type MOSFET (Metal Oxide Semiconductor Field Effect Transistor) is described. The present disclosure is not limited thereto. That is, each of the driving transistor DTR and the first and second switching transistors STR1 and STR2 may be embodied as a P-type MOSFET. Alternatively, some of the driving transistor DTR and the first and second switching transistors STR1 and STR2 may be embodied as an N-type MOSFET, while the other thereof may be embodied as a P-type MOSFET.

Figure 4:
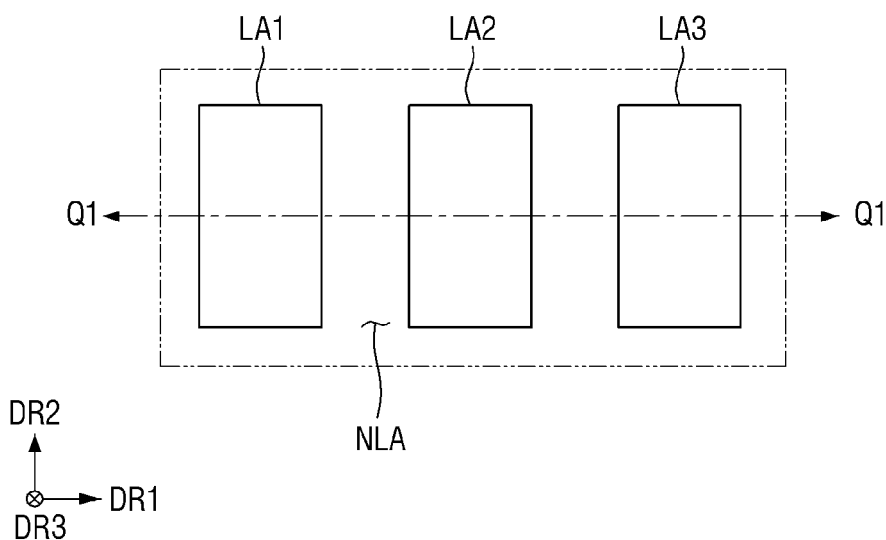
FIG. 4 is a plan view showing a pixel of an organic light-emitting display device according to an embodiment.
Figure 5:
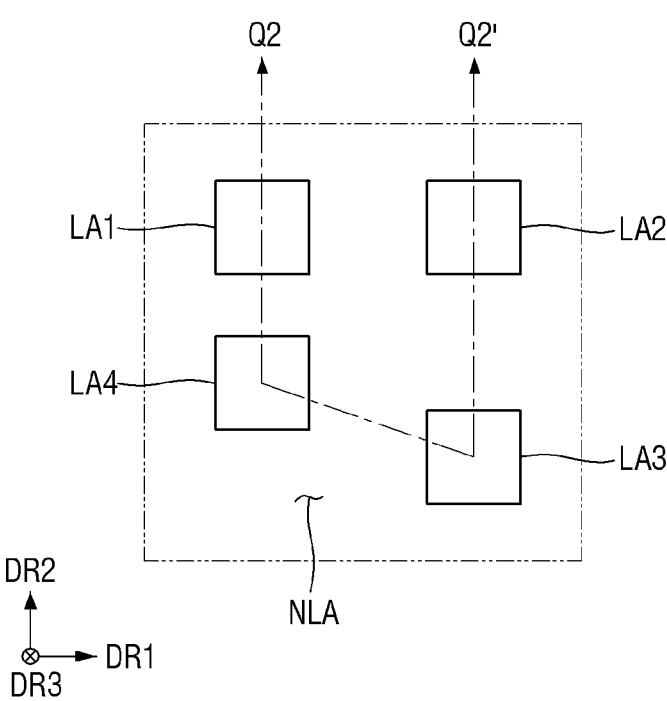
FIG. 5 is a plan view showing a pixel of an organic light-emitting display device according to a modification of FIG. 4.

FIG. 4 is a plan view showing a pixel of an organic light-emitting display device according to an embodiment. FIG. 5 is a plan view showing a pixel of an organic light-emitting display device according to a modified example of FIG. 4.

Referring to FIG. 4, a plurality of light-emitting areas LA1, LA2, and LA3 and a non-light-emitting area NLA may be defined in a display area DPA and on a substrate. In some embodiments, the plurality of light-emitting areas LA1, LA2, and LA3 of the display area DPA may include a first light-emitting area LA1, a second light-emitting area LA2 and a third light-emitting area LA3. Each of the first light-emitting area LA1, the second light-emitting area LA2, and the third light-emitting area LA3 may be an area in which light generated from a light-emitting element of the substrate emits to an outside, while the non-light-emitting area NLA may be an area in which light does not emit to the outside.

In some embodiments, light beams respectively emitting from the first light-emitting area LA1, the second light-emitting area LA2, and the third light-emitting area LA3 to the outside may have different colors. For example, the first light-emitting area LA1 may emit light of a first color, the second light-emitting area LA2 may emit light of a second color, and the third light-emitting area LA3 may emit light of a third color. In this arrangement, the light of the first color may be blue light having a peak wavelength in a range of about 440 nm to about 480 nm. The light of the second color may be red light having a peak wavelength in a range of about 610 nm to about 650 nm. The light of the third color may be green light having a peak wavelength in a range of about 510 nm to about 550 nm. However, the present disclosure is not limited thereto. The light of the second color may be green light and the light of the third color may be red light.

In some embodiments, the first light-emitting area LA1, the second light-emitting area LA2, and the third light-emitting area LA3 may constitute a single group. A plurality of groups may be defined in the display area DPA.

In some embodiments, as shown in FIG. 4, the first light-emitting area LA1, the second light-emitting area LA2, and the third light-emitting area LA3 may be sequentially arranged along one direction. In some embodiments, the first light-emitting area LA1, the second light-emitting area LA2, and the third light-emitting area LA3 may constitute a single group and may be repeatedly arranged within the display area DPA.

However, the present disclosure is not limited thereto. An arrangement of the first light-emitting area LA1, the second light-emitting area LA2, and the third light-emitting area LA3 may vary.

As shown in FIG. 5, in some embodiments, a plurality of light-emitting areas LA1, LA2, LA3, and LA4 in the display area DPA may include not only a first light-emitting area LA1, a second light-emitting area LA2, and a third light-emitting area LA3, but also a fourth light-emitting area LA4. In this case, the second light-emitting area LA2 may be spaced from the first light-emitting area LA1 in the first direction DR1. The third light-emitting area LA3 may be spaced from the second light-emitting area LA2 in a direction opposite to the second direction DR2. Further, the fourth light-emitting area LA4 may be spaced from the first light-emitting area LA1 in a direction opposite to the second direction DR2.

The fourth light-emitting area LA4 may emit light of the first color which the first light-emitting area LA1 emits. In some embodiments, the first light-emitting area LA1, the second light-emitting area LA2, the third light-emitting area LA3, and the fourth light-emitting area (LA4) may constitute a single group, and a plurality of groups may be defined in the display area DPA. Further, the first light-emitting area LA1, the second light-emitting area LA2, the third light-emitting area LA3, and the fourth light-emitting area LA4 may constitute a single group and may be repeatedly arranged within the display area DPA.

Figure 6:
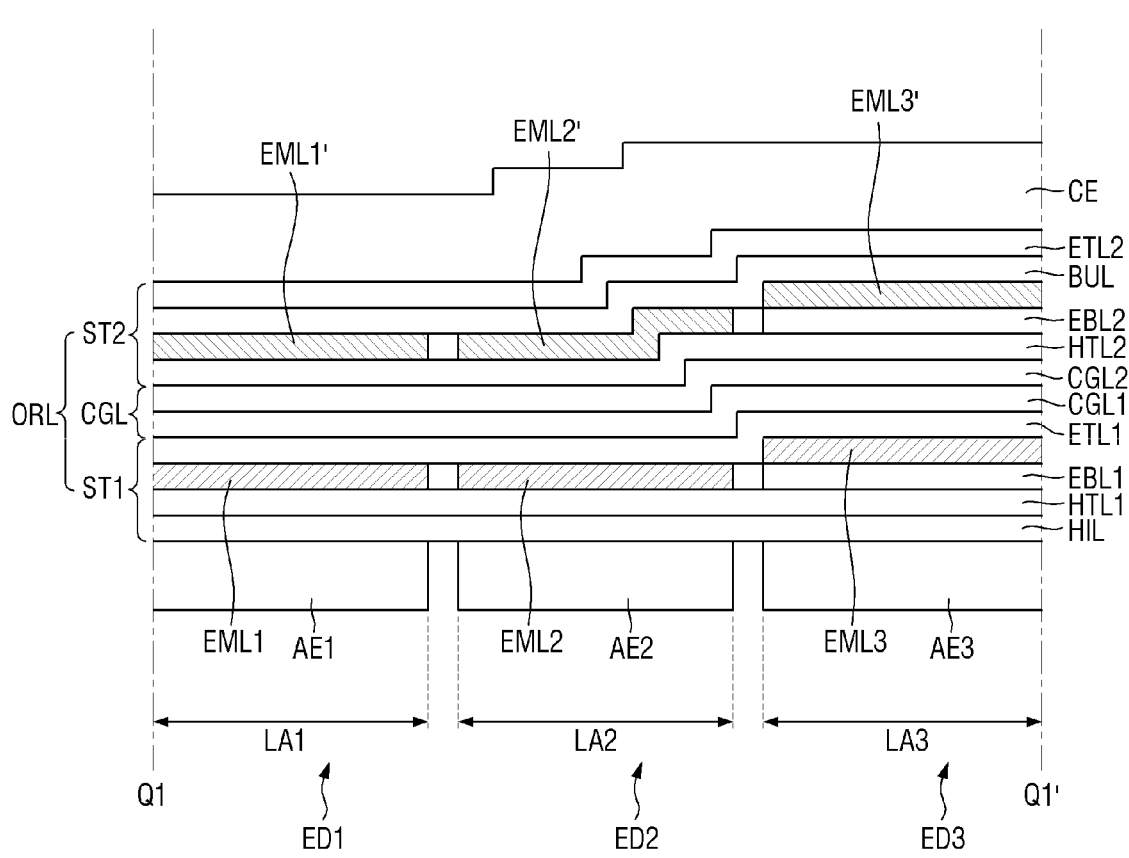
FIG. 6 is a cross-sectional view taken along a line Q1-Q1' in FIG. 4.
Figure 7:
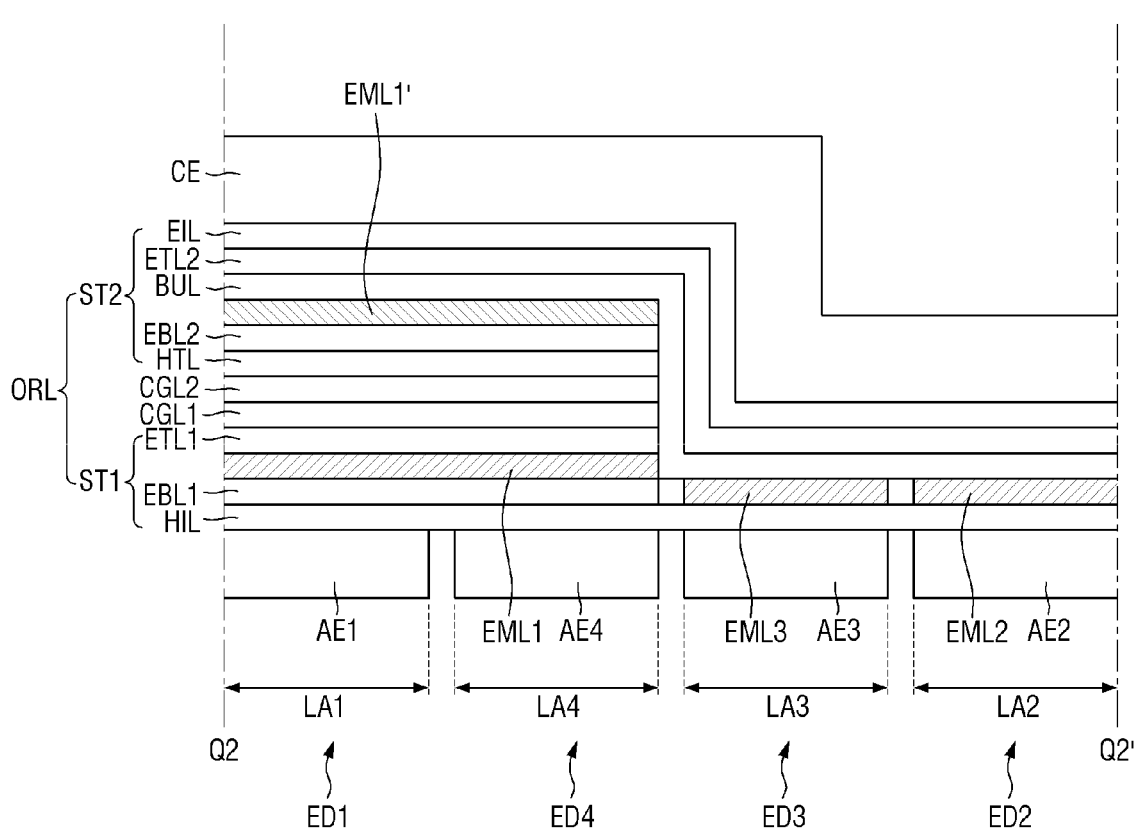
FIG. 7 is a cross-sectional view taken along a line Q2-Q2' in FIG. 5.

FIG. 6 is a cross-sectional view taken along a line Q1-Q1' in FIG. 4. FIG. 7 is a cross-sectional view taken along a line Q2-Q2' in FIG. 5.

FIG. 6 and FIG. 7 schematically show an anode electrode AE, an organic layer ORL, and a cathode electrode CE of an organic light-emitting element OLE of the display device 1.

Referring to FIG. 6, anode electrodes AE1, AE2, and AE3 may be disposed in the first light-emitting area LA1, the second light-emitting area LA2, and the third light-emitting area LA3, respectively. The first anode electrode AE1 may be disposed to vertically overlap the first light-emitting area LA1. The second anode electrode AE2 may be disposed to vertically overlap the second light-emitting area LA2. The third anode electrode AE3 may be disposed to vertically overlap the third light-emitting area LA3.

In some embodiments, each of the first anode electrode AE1, the second anode electrode AE2, and the third anode electrode AE3 may be a reflective electrode. In this case, each of the first anode electrode AE1, the second anode electrode AE2 and the third anode electrode AE3 may be a metal layer including a metal such as Ag, Mg, Al, Pt, Pd, Au, Ni, Nd, Ir and Cr. In another embodiment, each of the first anode electrode AE1, the second anode electrode AE2, and the third anode electrode AE3 may further include a metal oxide layer stacked on the metal layer. In an embodiment, each of the first anode electrode AE1, the second anode electrode AE2 and the third anode electrode AE3 may have a multilayer structure, for example, a two-layer structure such as ITO/Ag, Ag/ITO, ITO/Mg, ITO/MgF$_2$ or a three-layer structure such as ITO/Ag/ITO.

In some embodiments, the organic layer ORL may have a structure in which a plurality of light-emitting layers may be disposed to overlap each other, for example, a tandem structure. In one example, the organic layer ORL may include a first stack ST1 including lower light-emitting layers EML1, EML2, and EML3, a second stack ST2 disposed above the first stack ST1 and including upper light-emitting layers EML1', EML2', and EML3', and a charge generation layer CGL positioned between the first stack ST1 and the second stack ST2. The first stack ST1 and the second stack ST2 may be disposed on top of each other in the third direction DR3.

The lower light-emitting layers EML1, EML2, and EML3 and the upper light-emitting layers EML1', EML2', and EML3' may overlap each other in the third direction DR3.

In some embodiments, each of the first lower light-emitting layer EML1 and the first upper light-emitting layer EML1' may emit light of the first color, for example, blue light. Each of the second lower light-emitting layer EML2 and the second upper light-emitting layer EML2' may emit light of the second color, for example, red light. Each of the third lower light-emitting layer EML3 and the third upper light-emitting layer EML3' may emit light of the third color, for example, green light. That is, light finally emitted from the organic layer ORL may be blue light in the first light-emitting area LA1, red light in the second light-emitting area LA2, and may be green light in the third light-emitting area LA3.

In some embodiments, each of the first lower light-emitting layer EML1 and the first upper light-emitting layer EML1' emitting blue light may include a host and a dopant. A material of the host is not particularly limited as long as the material is a commonly used material. For example, the host may include Alq3 (tris(8-hydroxyquinolino)aluminum), CBP (4,4'-bis(N-carbazolyl)-1,1'-biphenyl), PVK (poly(n-vinylcabazole)), AND (9,10-di(naphthalene-2-yl)anthracene), TCTA (4,4',4''-Tris(carbazol-9-yl)-triphenylamine), TPBi (1,3,5-tris(N-phenylbenzimidazole-2-yl)benzene), TBADN (3-tert-butyl-9,10-di(naphth-2-yl)anthracene), DSA (distyrylarylene), CDBP (4,4'-bis(9-carbazolyl)-2,2''-dimethyl-biphenyl), MADN (2-Methyl-9,10-bis(naphthalen-2-yl)anthracene), etc.

Further, each of the first lower light-emitting layer EML1 and the first upper light-emitting layer EML1' emitting blue light may include a fluorescent material including at least one selected from a group consisting of, for example, spiro-DPVBi, spiro-6P, DSB (distyryl-benzene), DSA (distyryl-arylene). PFO (Polyfluorene)-based polymers, and PPV (poly(p-phenylene vinylene)-based polymers. In another example, each of the first lower light-emitting layer EML1 and the first upper light-emitting layer EML1' emitting blue light may include a phosphorescent material including organometallic complex such as (4,6-F2ppy) 2Irpic.

In some embodiments, each of the second lower light-emitting layer EML2 and the second upper light-emitting layer EML2' emitting red light may include a host material including CBP (carbazole biphenyl) or mCP (1,3-bis (carbazol-9-yl). Each of the second lower light-emitting layer EML2 and the second upper light-emitting layer EML2' emitting red light may include a phosphorescent material including a dopant including one or more selected from a group consisting of PIQIr (acac)(bis(1-phenylisoquinoline) acetylacetonate iridium), PQIr (acac)(bis(I-phenylquinoline) acetylacetonate iridium), PQIr (tris(1-phenylquinoline) iridium), and PtOEP (octaethylporphyrin platinum). Alternatively, each of the second lower light-emitting layer EML2 and the second upper light-emitting layer EML2' emitting red light may include a fluorescent material including PBD:Eu(DBM)$_3$(Phen) or Perylene. However, the disclosure is not limited thereto.

In some embodiments, each of the third lower light-emitting layer EML3 and the third upper light-emitting layer EML3' emitting green light may include a host material including CBP or mCP. Each of the third lower light-emitting layer EML3 and the third upper light-emitting layer EML3' emitting green light may include a phosphorescent material including a dopant material including Ir(ppy)3 (fac tris(2-phenylpyridine)iridium). Alternatively, each of the third lower light-emitting layer EML3 and the third upper light-emitting layer EML3' emitting green light may include a fluorescent material including Alq3 (tris(8-hydroxyquino-lino)aluminum). However, the disclosure is not limited thereto.

The charge generation layer CGL may be disposed between the first stack ST1 and the second stack ST2. The charge generation layer CGL may serve to inject charges into each of the light-emitting layers. The charge generation layer CGL may serve to adjust a charge balance between the first stack ST1 and the second stack ST2. The charge generation layer CGL may include an n-type charge generation layer CGL1 and a p-type charge generation layer CGL2. The p-type charge generation layer CGL2 may be disposed on the n-type charge generation layer CGL1, and may be positioned between the n-type charge generation layer CGL1 and the second stack ST2.

The charge generation layer CGL may have a junction structure between the n-type charge generation layer CGL1 and the p-type charge generation layer CGL2. The n-type charge generation layer CGL1 may be disposed closer to the anode electrodes AE1, AE2, and AE3 than to the cathode electrode CE. The p-type charge generation layer CGL2 may be disposed closer to the cathode electrode CE than to the anode electrodes AE1, AE2, and AE3. The n-type charge generation layer CGL1 supplies electrons to the lower light-emitting layers EML1, EML2, and EML3 respectively adjacent to the anode electrodes AE1, AE2, and AE3, while the p-type charge generation layer CGL2 supplies holes to the upper light-emitting layers EML1', EML2', and EML3' included in the second stack ST2. The charge generation layer CGL may be disposed between the first stack ST1 and the second stack ST2 to provide charges to each of the light-emitting layers, thereby increasing light-emitting efficiency and lowering a drive voltage.

The first stack ST1 may be disposed on the first anode electrode AE1, the second anode electrode AE2, and the third anode electrode AE3, and may further include a first hole transport layer HTL1, a first electron blocking layer EBL1, and a first electron transport layer ETL1.

The first hole transport layer HTL1 may be disposed on the first anode electrode AE1, the second anode electrode AE2, and the third anode electrode AE3. The first hole transport layer HTL1 serves to facilitate transport of holes, and may include a hole transport material. The hole transport material may include carbazole-based derivatives such as N-phenylcarbazole and polyvinylcarbazole, fluorene-based derivatives, triphenylamine-based derivatives such as TPD (N,N'-bis(3-methylphenyl)-N,N'-diphenyl-[1,1-biphenyl]-4, 4'-diamine) or TCTA (4,4',4''-tris(N-carbazolyl)triphenylamine), NPB (N,N'-di(1-naphthyl)-N,N'-diphenylbenzidine), and TAPC (4,4'-Cyclohexylidene bis[N,N-bis(4-methylphenyl)benzenamine]). The present disclosure is not limited thereto.

The first electron blocking layer EBL1 may be disposed on the first hole transport layer HTL1, and may be positioned between the first hole transport layer HTL1 and the lower light-emitting layers EML1, EML2, and EML3. The first electron blocking layer EBL1 may include a hole transport material and a metal or a metal compound to prevent electrons generated from the lower light-emitting layers EML1, EML2, and EML3 from moving to the first hole transport layer HTL1. In some embodiments, each of the first hole transport layer HTL1 and the first electron blocking layer EBL1 as described above may be composed of a single layer including a mixture of materials.

The first electron transport layer ETL1 may be disposed on the lower light-emitting layers EML1, EML2, and EML3, and may be disposed between the charge generation layer CGL and the lower light-emitting layers EML1, EML2, and EML3. In some embodiments, the first electron transport layer ETL1 may include an electron transport material such as Alq3 (Tris(8-hydroxyquinolinato)aluminum), TPBi (1,3,5-Tri(1-phenyl-1H-benzo[d]imidazol-2-yl)phenyl), BCP (2,9-Dimethyl-4,7-diphenyl-1,10-phenanthroline), Bphen (4,7-Diphenyl-1,10-phenanthroline), TAZ (3-(4-Biphenylyl)-4-phenyl-5-tert-butylphenyl-1,2,4-triazole), NTAZ (4-(Naphthalen-1-yl)-3,5-diphenyl-4H-1,2,4-triazole), tBu-PBD (2-(4-Biphenylyl)-5-(4-tert-butylphenyl)-1,3, 4-oxadiazole), BAlq (Bis(2-methyl-8-quinolinolato-N1, O8)-(1,1'-Biphenyl-4-olato)aluminum), Bebq2 (berylliumbis(benzoquinolin-10-olate), AND (9,10-di(naphthalene-2-yl)anthracene) or mixtures thereof. However, the present disclosure is not limited to the type of the electron transport material as described above.

The second stack ST2 may be disposed on the charge generation layer CGL, and may further include a second hole transport layer HTL2, a second electron blocking layer EBL2, a buffer layer BUL, and a second electron transport layer ETL2.

The second hole transport layer HTL2 may be disposed on the charge generation layer CGL. The second hole transport layer HTL2 may be made of the same material as that of the first hole transport layer HTL1, or may include at least one selected from the materials exemplified above as the material of the first hole transport layer HTL1. The second hole transport layer HTL2 may be composed of a single layer or a plurality of layers.

The second electron blocking layer EBL2 may be disposed on the second hole transport layer HTL2, and may be disposed between the second hole transport layer HTL2 and the upper light-emitting layers EML1', EML2', and EML3'. The second electron blocking layer EBL2 may be made of the same material as that of the first electron blocking layer EBL1 and have the same structure as that of the first electron blocking layer EBL1, or may include at least one selected from the materials exemplified above as the material of the first electron blocking layer EBL1.

The second electron transport layer ETL2 may be disposed on the upper light-emitting layers EML1', EML2', and EML3', and may be disposed between the upper light-emitting layers EML1'. EML2', and EML3' and the cathode electrode CE. The second electron transport layer ETL2 may be made of the same material as that of the first electron transport layer ETL1 and have the same structure as that of the first electron transport layer ETL1, or may include at least one selected from the materials exemplified above as the material of the first electron transport layer ETL1. The second electron transport layer ETL2 may be composed of a single layer or a plurality of layers.

The buffer layer BUL may be disposed between the upper light-emitting layers EML1', EML2', and EML3' and the second electron transport layer ETL2. The buffer layer BUL may prevent holes from moving from the upper light-emitting layers EML1', EML2', and EML3' to the cathode electrode CE. The buffer layer BUL may include a material having hole characteristics. For example, the buffer layer BUL may include a hole transport layer material. The disclosure is not limited thereto.

Although not shown in the drawings, a hole injection layer (not shown) may be further disposed between the first stack ST1 and the first anode electrode AE1, between the second anode electrode AE2 and the third anode electrode AE3, and/or between the second stack ST2 and the charge generation layer CGL1. The hole injection layer may serve to allow holes to be more smoothly injected into the lower light-emitting layers EML1, EML2, and EML3 and upper light-emitting layers EML1', EML2', and EML3'. In some embodiments, the hole injection layer may include at least one selected from a group consisting of CuPc (cupper phthalocyanine). PEDOT (poly(3,4)-ethylenedioxythiophene), PANI (polyaniline), and NPD (N,N-dinaphthyl-N, N'-diphenyl benzidine). The disclosure is not limited thereto.

Further, although not shown in the drawings, an electron injection layer (not shown) may be further disposed between the second electron transport layer ETL2 and the cathode electrode CE, and/or between the charge generation layer CGL and the first stack ST. The electron injection layer serves to facilitate the injection of electrons and may include Alq3 (tris(8-hydroxyquinolino)aluminum), PBD, TAZ, spiro-PBD, BAlq, or SAlq. The disclosure is not limited thereto. Further, the electron injection layer may be made of a metal halide compound, for example, at least one selected from a group consisting of $MgF_2$, LiF, NaF, KF, RbF, CsF, FrF, LiI, NaI, KI, RbI, CsI, FrI, and $CaF_2$. The disclosure is not limited thereto. In addition, the electron injection layer may include a lanthanide-based material such as Yb, Sm, or Eu. Alternatively, the electron injection layer may include a combination of a metal halide material and a lanthanide material such as RbI:Yb, KI:Yb, etc. When the electron injection layer includes the combination of the metal halide material and the lanthanum material, the electron injection layer may be formed by co-deposition of the metal halide material and the lanthanum material.

The cathode electrode CE may be disposed on the above-described organic layer ORL. The cathode electrode CE may be semi-transmissive or transmissive. When the cathode electrode CE is semi-transmissive, the cathode electrode CE may include Ag, Mg, Cu, Al, Pt, Pd, Au, Ni, Nd, Ir, Cr, Li, Ca, LiF/Ca, LiF/Al, Mo, Ti, or a compound or a mixture thereof, for example, a mixture of Ag and Mg. Further, when a thickness of the cathode electrode CE is several tens to several hundreds of angstroms, the cathode electrode CE may be semi-transmissive.

When the cathode electrode CE is transmissive, the cathode electrode CE may include a transparent conductive oxide (TCO). For example, the cathode electrode CE may include $W_xO_y$ (tungsten oxide), $TiO_2$ (Titanium oxide), ITO (indium tin oxide), IZO (indium zinc oxide), ZnO (zinc oxide), ITZO (indium tin zinc oxide), MgO (magnesium oxide), etc.

The first anode electrode AE1, the organic layer ORL and the cathode electrode CE may constitute a first light-emitting element ED1; the second anode electrode AE2, the organic layer ORL and the cathode electrode CE may constitute a second light-emitting element ED2; and the third anode electrode AE3, the organic layer ORL, and the cathode electrode CE may constitute a third light-emitting element ED3. Each of the first light-emitting element ED1, the second light-emitting element ED2, and the third light-emitting element ED3 may emit light. For example, the first light-emitting element ED1 emits blue light, the second light-emitting element ED2 emits red light, and the third light-emitting element ED3 may emit green light.

In one example, referring to FIG. 7, the organic layer ORL may have a tandem structure in which layers are shared between the first light-emitting area LA1 and the fourth light-emitting area LA4. In this particular embodiment, the tandem structure does not extend to the second light-emitting area LA2 and the third light-emitting area LA3, each of which has its own light emitting layer (EML2 and EML3).

In one embodiment, the organic layer ORL in each of the first light-emitting area LA1 and the fourth light-emitting area LA4 may share the first stack ST1 including the lower light-emitting layer EML1, the second stack ST2 disposed above the first stack ST1 and including the upper light-emitting layer EML1', and the charge generation layer CGL positioned between the first stack ST1 and the second stack ST2. The first stack ST1 and the second stack ST2 may be disposed to overlap each other in the third direction DR3. The organic layer ORL in each of the second light-emitting area LA2 and the third light-emitting area LA3 may have a single stack structure including separate lower light-emitting layers EML2 and EML3, respectively.

The first light-emitting area LA1, the second light-emitting area LA2, the third light-emitting area LA3 and the fourth light-emitting area LA4 may include the anode electrodes AE1, AE2, AE3, and AE4, respectively. The first anode electrode AE1 may be disposed to overlap the first light-emitting area LA1. The second anode electrode AE2 may be disposed to overlap the second light-emitting area LA2. The third anode electrode AE3 may be disposed to overlap the third light-emitting area LA3 in the third direction DR3. The fourth anode electrode AE4 may be disposed to overlap the fourth light-emitting area LA4 in the third direction DR3.

In each of the first light-emitting area LA1 and the fourth light-emitting area LA4, the first lower light-emitting layer EML1 and the first upper light-emitting layer EML1' may be disposed to overlap each other. The second lower light-emitting layer EML2 may be disposed in the second light-emitting area LA2. The third lower light-emitting layer EML3 may be disposed in the third light-emitting area LA3. In some embodiments, each of the first lower light-emitting layer EML1 and the first upper light-emitting layer EML1' may emit light of the first color, for example, blue light. The second lower light-emitting layer EML2 may emit light of the second color, for example, red light. The third lower light-emitting layer EML3 may emit light of the third color, for example, green light. That is, the light that is emitted from the organic layer ORL may be blue light in each of the first light-emitting area LA1 and the fourth light-emitting area LA4, the red light in the second light-emitting area LA2, and the green light in the third light-emitting area LA3.

The charge generation layer CGL may be disposed between the first stack ST1 and the second stack ST2 in each of the first light-emitting area LA1 and the fourth light-emitting area LA4.

The first stack ST1 in each of the first light-emitting area LA1 and the fourth light-emitting area LA4 may be disposed on each of the first anode electrode AE1 and the fourth anode electrode AE4, and may further include the first hole injection layer HIL1, the first electron blocking layer EBL1, and the first electron transport layer ETL1. In each of the second light-emitting area LA2 and the third light-emitting area LA3, the first hole injection layer HIL1 may be disposed on each of the second anode electrode AE2 and the third anode electrode AE3.

The first hole injection layer HIL1 may be disposed on the first anode electrode AE1, the second anode electrode AE2, the third anode electrode AE3, and the fourth anode electrode AE4. The first electron blocking layer EBL1 may be disposed on the first hole injection layer HIL1, and may be positioned between the first hole injection layer HIL1 and the first lower light-emitting layer EML1. The first electron blocking layer EBL1 may cover the first anode electrode AE1 and the fourth anode electrode AE4, but not the second anode electrode AE2 and the third anode electrode AE3.

The first electron transport layer ETL1 may be disposed on the first lower light-emitting layer EML1, and may be disposed between the charge generation layer CGL and the first lower light-emitting layer EML1. The first electron transport layer ETL1 may overlap the first anode electrode AE1 and the fourth anode electrode AE4, and may not overlap the second anode electrode AE2 and the third anode electrode AE3.

The second stack ST2 in each of the first light-emitting area LA1 and the fourth light-emitting area LA4 may be disposed on the charge generation layer CGL, and may include the hole transport layer HTL, the second electron blocking layer EBL2, the buffer layer BUL, the second electron transport layer ETL2, and the electron injection layer EIL. Each of the second light-emitting area LA2 and the third light-emitting area LA3 may include the buffer layer BUL on each of the second lower light-emitting layer EML2 and the third lower light-emitting layer EML3, the second electron transport layer ETL2 on the buffer layer, and the electron injection layer EIL on the second electron transport layer ETL2.

The hole transport layer HTL may be disposed on the charge generation layer CGL, and may not overlap the second light-emitting area LA2 and the third light-emitting area LA3. The second electron blocking layer EBL2 may be disposed on the hole transport layer HTL, and may be disposed between the hole transport layer HTL and the first upper light-emitting layer EML1'. The second electron blocking layer EBL2 may not cover the second light-emitting area LA2 and the third light-emitting area LA3.

The buffer layer BUL may be disposed between the first upper light-emitting layer EML1 and the second electron blocking layer EBL2. Further, the buffer layer BUL may be disposed on the second lower light-emitting layer EML2 and the third lower light-emitting layer EML3.

The second electron transport layer ETL2 may be disposed on the first upper light-emitting layer EML1', and may be disposed between the first upper light-emitting layer EML1' and the cathode electrode CE. Further, the second electron transport layer ETL2 may be disposed on the second lower light-emitting layer EML2 and the third lower light-emitting layer EML3.

The electron injection layer EIL may be disposed on the second electron transport layer ETL2, and may be disposed on the second lower light-emitting layer EML2 and the third lower light-emitting layer EML3.

The first anode electrode AE1, the organic layer ORL and the cathode electrode CE may constitute the first light-emitting element ED1; the second anode electrode AE2, the organic layer ORL and the cathode electrode CE may constitute the second light-emitting element ED2; and the third anode electrode AE3, the organic layer ORL, and the cathode electrode CE may constitute the third light-emitting element ED3. Further, the fourth anode electrode AE2, the organic layer ORL, and the cathode electrode CE may constitute a fourth light-emitting element ED4. For example, each of the first light-emitting element ED1 and the fourth light-emitting element ED4 emit blue light, the second light-emitting element ED2 emits red light, and the third light-emitting element ED4 may emit green light.

In FIGS. 6 and 7 as described above, the charge generation layer CGL may act as a common layer that extends along the plurality of light-emitting areas and continuously. For example, in FIG. 6, the charge generation layer CGL may act as a common layer continuously extending along the first light-emitting area LA1, the second light-emitting area LA2, and the third light-emitting area LA3. Further, in FIG. 7, the charge generation layer CGL may act as a common layer continuously extending along the first light-emitting area LA1 and the fourth light-emitting area LA4.

The charge generation layer CGL may play a role in generating and transporting the electrons and holes that contribute to substantial light emission. When the charge generation layer CGL acts as the common layer, leakage current may occur when the charges (electrons and holes) generated in the light-emitting area are transferred to the light-emitting area adjacent thereto. In this case, due to the leakage current, light may emit in a light-emitting area in which light should not emit. Thus, color mixing may occur or an unwanted gray level may be displayed.

This embodiment may provide a display device in which a portion of the charge generation layer CGL does not continuously extend between the light-emitting areas, thereby reducing the leakage current and color mixing and improving the gray level displaying, and may provide a method for manufacturing the same.

Figure 8:
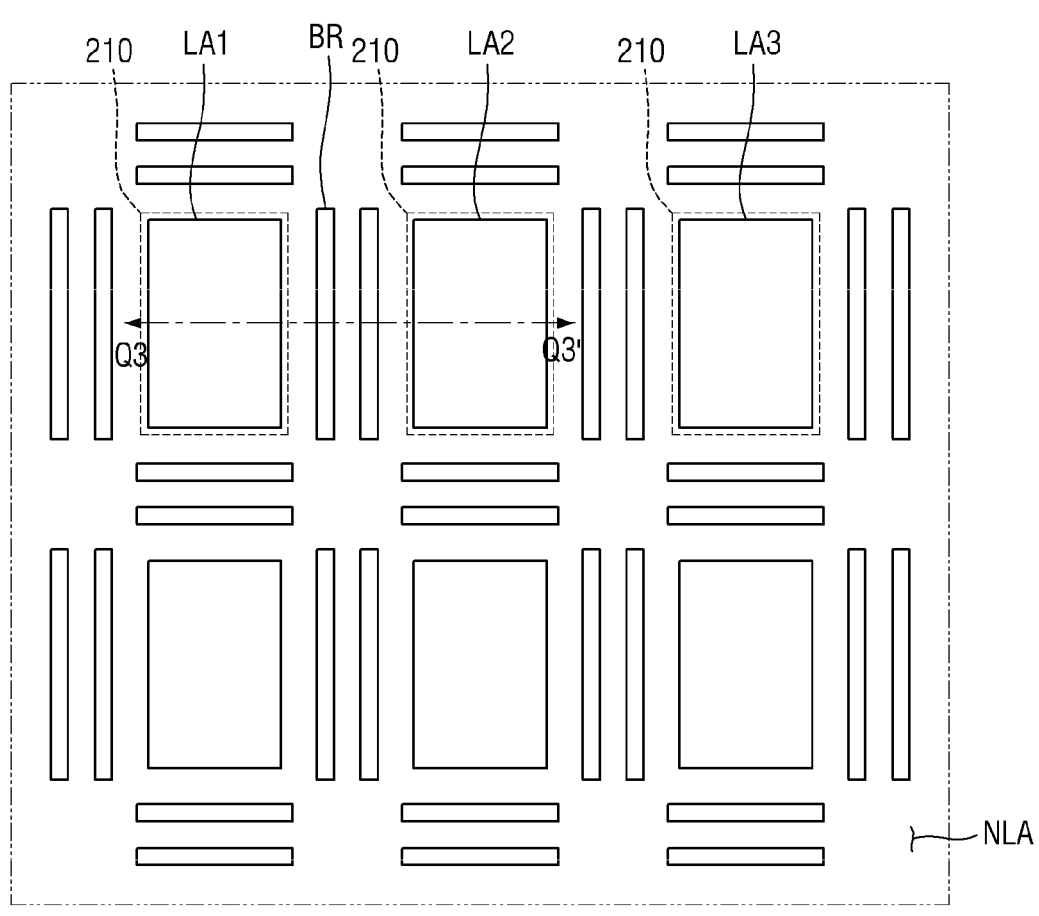
FIG. 8 is a plan view showing a pixel of a display device according to an embodiment.
Figure 8:
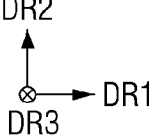
Figure 9:
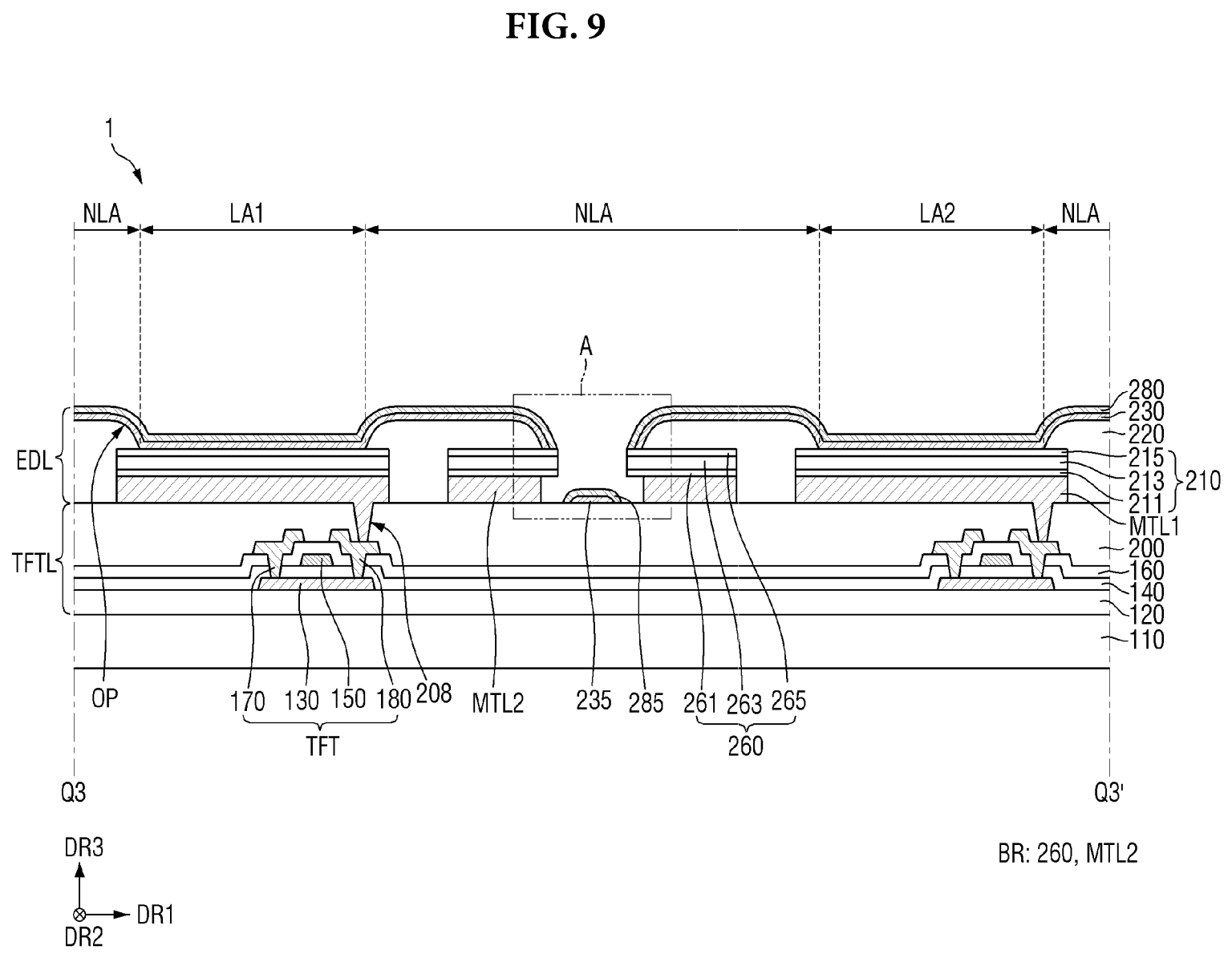
Figure 10:
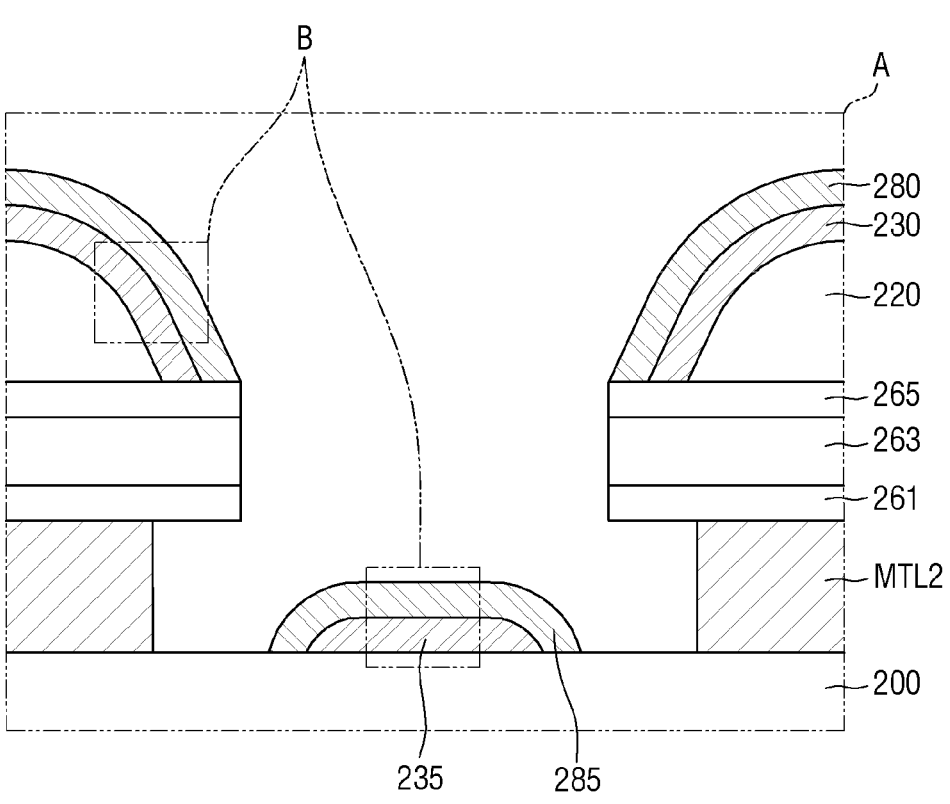
FIG. 10 is an enlarged cross-sectional view of an area A of FIG. 9.
Figure 11:
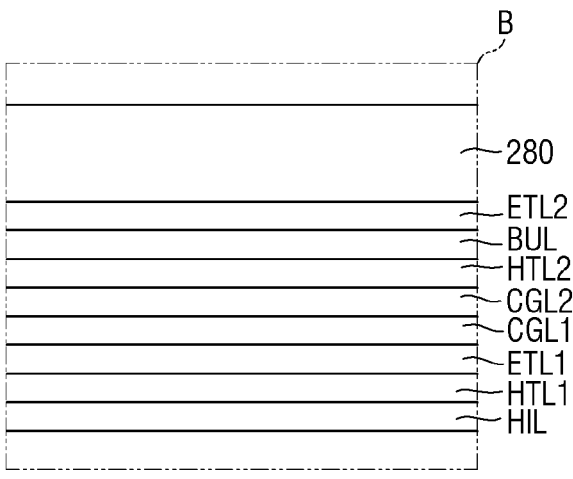
FIG. 11 is an enlarged view of an area B of FIG. 10.

FIG. 8 is a plan view showing a pixel of a display device according to an embodiment. FIG. 9 is a cross-sectional view taken along a line Q3-Q3' in FIG. 8. FIG. 10 is an enlarged cross-sectional view of an area A of FIG. 9. FIG. 11 is an enlarged view of an area B of FIG. 10.

FIG. 8 illustrates a pixel structure of FIG. 5 by way of example. FIG. 9 illustrates a cross-sectional structure of a portion between the first light-emitting area LA1 and the second light-emitting area LA2 by way of example. FIG. 11 shows a cross-sectional structure of the organic layer ORL and the cathode electrode CE in the area B of FIG. 10 by way of example.

Referring to FIGS. 8 to 11, a display device 1 according to an embodiment may include a first light-emitting area LA1, a second light-emitting area LA2, and a third light-emitting area LA3. The first light-emitting area LA1, the second light-emitting area LA2, and the third light-emitting area LA3 may constitute a single group and may be repeatedly arranged. A non-light-emitting area NLA may be disposed in an area other than the first light-emitting area LA1, the second light-emitting area LA2, and the third light-emitting area LA3. The arrangement of the light-emitting areas has been described above, and thus will be omitted.

In one embodiment, each of the light-emitting areas LA1, LA2, and LA3 may include a first electrode 210. A plurality of partitioning walls BR may be disposed between the light-emitting areas LA1, LA2, and LA3.

The partitioning walls BR may be arranged outside of each of the light-emitting areas LA1, LA2, and LA3 partially outlining the sides of the light-emitting areas LA1, LA2, and LA3, and the first electrode 210 is disposed in each of the light-emitting areas LA1, LA2, and LA3. The partitioning wall BR may be spaced apart from each first electrode 210 and may be disposed in the non-light-emitting area NLA that is mutually exclusive with the light-emitting areas LA1/2/3. In the embodiment of FIG. 8, at least two partitioning walls BR may be present between the light-emitting areas LA1, LA2, and LA3. For example, two partitioning walls BR may be disposed between the first light-emitting area LA1 and the second light-emitting area LA2. The partitioning wall BR disposed between the first light-emitting area LA1 and the second light-emitting area LA2 may extend parallel to each other, and parallel to a direction that extends parallel to a side of the first light-emitting area LA1 and/or the second light-emitting area LA2 in a DR1-DR2 plan view. Further, the partitioning wall BR may extend in a parallel manner to at least one side of each of the first electrodes 210.

The partitioning wall BR may have a length measured in the second direction DR2. The length of the partitioning wall BR may be larger than a length of at least one side of the first light-emitting area LA1 or the second light-emitting area LA2. For example, the length of the partitioning wall BR may be larger than the length of the first light-emitting area LA1 or the second light-emitting area LA2 as measured in the second direction DR2. However, the present disclosure is not limited thereto. The length of the partitioning wall BR in the second direction DR2 may be equal to or smaller than the length of the first light-emitting area LA1 or the second light-emitting area LA2 as measured in the second direction DR2. Further, the length of the partitioning wall BR may be larger than a length of at least one side of the first electrode 210. For example, the length of the partitioning wall BR as measured in the second direction DR2 may be larger than the length of the first electrode 210 as measured in the second direction DR2.

The partitioning wall BR may be disposed between the first light-emitting area LA1 and another first light-emitting area LA1 adjacent thereto in the second direction DR2. The partitioning wall BR disposed between the first light-emitting areas LA1 adjacent to each other in the second direction DR2 may have a length as measured in the first direction DR1. The length thereof may be larger than a width of the first light-emitting area LA1 as measured in the first direction DR1. However, the present disclosure is not limited thereto. The length of the partitioning wall BR in the first direction DR1 may be equal to or smaller than the width of the first light-emitting area LA1 as measured in the first direction DR1.

In the embodiment of FIG. 8, the lengths of the partitioning walls BR adjacent to each other in the first direction DR1 or the second direction DR2 are equal to each other. However, the present disclosure is not limited thereto. The lengths of the partitioning walls BR adjacent to each other in the first direction DR1 or the second direction DR2 may be different from each other. For example, a length in the second direction DR2 of the partitioning wall BR adjacent to the first light-emitting area LA1 among the partitioning walls BR disposed between the first light-emitting area LA1 and the second light-emitting area LA2 may be larger or smaller than a length in the second direction DR2 of the partitioning wall BR adjacent to the second light-emitting area LA2 among the partitioning walls BR disposed between the first light-emitting area LA1 and the second light-emitting area LA2.

The partitioning walls BR disposed adjacent to each other may be spaced apart from each other by a predetermined distance. The spacing may not be fixed to a particular distance, but may be adjusted in according to a spacing between the first light-emitting area LA1 and the second light-emitting area LA2 or a spacing between the first electrodes 210. Further, the number of the partitioning walls BR disposed adjacent to each other and between the first light-emitting area LA1 and the second light-emitting area LA2 or between the first electrodes 210 may be 3 or greater.

In the drawings, it is illustrated that the partitioning walls BR are respectively disposed between the first light-emitting area LA1 and the second light-emitting area LA2, between the second light-emitting area LA2 and the third light-emitting area LA3, and between the first light-emitting area LA1 and the third light-emitting area LA3. Although not explicitly shown, another first light-emitting area LA1 neighbors the third light-emitting area LA3 on the side opposite the side that neighbors the second light-emitting area LA2. The present disclosure is not limited thereto. The partitioning wall BR may be absent between the first light-emitting area LA1 and the second light-emitting area LA2 or between the second light-emitting area LA2 and the third light-emitting area LA3. Further, the partitioning wall BR may be absent between light-emitting areas emitting the same color. For example, the partitioning wall BR may be absent between the first light-emitting areas LA1 adjacent to each other in the second direction DR2.

More specifically, referring to FIG. 9, the display device 1 according to an embodiment may include a substrate 110, a thin-film transistor layer TFTL disposed on the substrate 110, and a light-emitting element layer EDL disposed on the thin-film transistor layer TFTL.

The substrate 110 may be embodied as a rigid substrate or a flexible substrate capable of bending, folding, rolling, and the like. The substrate 110 may be made of an insulating material such as glass, quartz, or polymer resin. Examples of the polymeric material may include polyethersulphone (PES), polyacrylate (PA), polyarylate (PAR), polyetherimide (PEI), polyethylenenapthalate (PEN), polyethyleneterephtalate (PET), polyphenylenesultide (PPS), polyallylate, polyimide (PI), polycarbonate (PC), cellulose triacetate (CAT), cellulose acetate propionate (CAP), or a combination thereof. The substrate 110 may include a metal material.

The thin-film transistor layer TFTL may be disposed on the substrate 110. The thin-film transistor layer TFTL may include a thin-film transistor TFT, a buffer film 120, a gate insulating layer 140, an interlayer insulating layer 160, and a planarization layer 200.

The buffer film 120 may be disposed on the substrate 110. The buffer film 120 may be disposed on the substrate 110 to protect the thin-film transistor TFT and the light-emitting element ED from moisture penetrating through the substrate 110 which is vulnerable to moisture permeation. The buffer film 120 may include a plurality of inorganic layers that are alternately stacked. For example, the buffer film 120 may be embodied as a multilayer in which one or more inorganic layers selected from among silicon oxide ($SiO_2$), silicon nitride (SiN), and silicon nitride (SiON) are alternately stacked. However, the present disclosure is not limited thereto. The buffer film 120 may be omitted.

The thin-film transistor TFT may be disposed on the buffer film 120. The thin-film transistor TFT may include an active layer 130, a gate electrode 150, a source electrode 170, and a drain electrode 180. FIG. 9 shows an example in which the thin-film transistor TFT has a top gate structure in which the gate electrode 150 is disposed above the active layer 130. The disclosure is not limited thereto. That is, the thin-film transistor TFT may have a bottom gate structure in which the gate electrode 150 is positioned below the active layer 130 or a double gate structure in which the gate electrode 150 is disposed above and below the active layer 130.

The active layer 130 may be disposed on the buffer film 120. The active layer 130 may include polycrystalline silicon, single crystal silicon, an oxide semiconductor, or the like. When the semiconductor layer includes the oxide semiconductor, the active layer 130 may include a plurality of conductive areas and a channel area therebetween. The oxide semiconductor may be an oxide semiconductor containing indium (In). For example, the oxide semiconductor may include Indium-Tin Oxide (ITO), Indium-Zinc Oxide (IZO), Indium-Gallium Oxide (IGO), Indium-Zinc-Tin Oxide (IZTO), Indium-Gallium-Tin Oxide (IGTO), Indium-Gallium-Zinc-Tin Oxide (IGZTO), or the like.

In another embodiment, the active layer 130 may include polycrystalline silicon. The polycrystalline silicon may be produced by crystallizing amorphous silicon. In this case, the conductive area of the active layer 130 may be embodied as a doped area doped with impurities.

A light blocking layer (not shown) for preventing external light from being incident to the active layer 130 may be further disposed between the buffer film 120 and the active layer 130. When the light blocking layer may be disposed therebetween, the light blocking layer may be disposed to overlap the active layer 130, and may be made of an opaque metal material that blocks light transmission therethrough.

The gate insulating layer 140 may be formed on the active layer 130. The gate insulating layer 140 may be disposed on the buffer film 120 and the active layer 130. The gate insulating layer 140 may be composed of an inorganic film, for example, an inorganic layer including silicon oxide ($SiO_2$), silicon nitride (SiN), or silicon oxynitride (SiON), or may be composed of a stack structure in which at least two inorganic layers including silicon oxide ($SiO_2$), silicon nitride (SiN), or silicon oxynitride (SiON) are stacked.

The gate electrode 150 may be disposed on the gate insulating layer 140. A gate line (not shown) and one electrode (not shown) of a storage capacitor, and the gate electrode 150 may constitute the same layer. That is, the gate line (not shown) and one electrode (not shown) of the storage capacitor may be coplanar with the gate electrode 150. The gate electrode 150 may be disposed to overlap the active layer 130 in a thickness direction of the device, that is, the third direction DR3. The gate electrode 150 may be composed of a single layer or a stack of multiple layers made of one of molybdenum (Mo), aluminum (Al), chromium (Cr), gold (Au), titanium (Ti), nickel (Ni), neodymium (Nd), and copper (Cu) or alloys thereof. The present disclosure is not limited thereto.

The interlayer insulating layer 160 may be disposed on the gate electrode 150. The interlayer insulating layer 160 may function as an insulating film between the gate electrode 150 and other layers disposed above the gate electrode. Further, the interlayer insulating layer 160 may be disposed to cover the gate electrode 150 and protect the gate electrode. The interlayer insulating layer 160 may be composed of an inorganic layer including an inorganic material, for example, silicon oxide ($SiO_2$), silicon nitride (SiN), or silicon oxynitride (SiON), or may be composed of a stack structure in which at least two layers made of silicon oxide (SiO$_2$), silicon nitride (SiN), and/or silicon oxynitride (SiON) are stacked.

The source electrode 170 and the drain electrode 180 may be disposed on the interlayer insulating layer 160. Each of the source electrode 170 and the drain electrode 180 may be connected to the active layer 130 via contact holes extending through the gate insulating layer 140 and the interlayer insulating layer 160, respectively. Each of the source electrode 170 and the drain electrode 180 may be composed of a single layer or a stack of multiple layers made of one of molybdenum (Mo), aluminum (Al), chromium (Cr), gold (Au), titanium (Ti), nickel (Ni), neodymium (Nd), and copper (Cu) or alloys thereof. The present disclosure is not limited thereto. Accordingly, the active layer 130, the gate electrode 150, the source electrode 170, and the drain electrode 180 may constitute the thin-film transistor TFT.

The planarization layer 200 for removing a step caused by the thin-film transistor TFT may be disposed on the source electrode 170 and the drain electrode 180. The planarization layer 200 may receive therein a via hole 208 via which the first electrode 210 is connected to the thin-film transistor TFT. The via hole 208 may be disposed to overlap the thin-film transistor TFT. The first electrode 210 may be connected to the drain electrode 180 of the thin-film transistor TFT via the via hole 208. The planarization layer 200 may include an organic material such as acryl resin, epoxy resin, phenolic resin, polyamide resin, and polyimide resin, and may perform a surface planarization function.

The light-emitting element layer EDL may be disposed on the planarization layer 200. The light-emitting element layer EDL may include light-emitting elements and a pixel defining layer 220. Each of the light-emitting elements ED1 and ED2 may include the first electrode 210, an organic layer 230, and a second electrode 240.

The first electrode 210 may act as a pixel electrode, and may be connected to the drain electrode 180 of the thin-film transistor TFT via the via hole 208. The first electrode 210 may act as an anode electrode and may be a reflective electrode. Specifically, the first electrode 210 may include a first lower layer 211, a first middle layer 213 disposed on the first lower layer 211, and a first upper layer 215 disposed on the first middle layer 213.

The first lower layer 211 may impart adhesive properties and conductive properties to the first electrode 210, and may include a transparent conductive material such as ITO, IZO, and ITZO. The first lower layer 211 may constitute the lowermost portion of the first electrode 210. The first middle layer 213 may act as a reflective layer that reflects light emitted from the organic layer ORL, and may include a metal material with high reflectivity such as aluminum (Al), silver (Ag), titanium (Ti), and APC alloy. The APC alloy may refer to an alloy of silver (Ag), palladium (Pd), and copper (Cu). The first upper layer 215 may transmit a driving current to the organic layer ORL, and may include a transparent conductive material such as ITO, IZO, and ITZO. The first upper layer 215 may constitute a topmost portion of the first electrode 210. The first electrode 210 may have a three-layer structure in which the first lower layer 211, the first middle layer 213 and the first upper layer 215 are stacked, for example, ITO/Al/ITO or ITO/APC/ITO.

A first metal layer MTL1 may be disposed between the first electrode 210 and the planarization layer 200. The first metal layer MTL1 may connect the thin-film transistor TFT and the first electrode 210 to each other and may impart reflective ability to the first electrode 210. The first metal layer MTL1 may include a material having conductivity, for example, one or more selected from aluminum (Al), silver (Ag), titanium (Ti) and APC alloy.

In some embodiments, the first electrode 210 and the first metal layer MTL1 may overlap each other in the third direction DR3 and may have the same planar size.

The pixel defining layer 220 may be disposed on the planarization layer 200 to cover an edge of the first electrode 210 and separate pixels from each other. The pixel defining layer 220 may have an opening OP defined therein exposing a portion of the lower first electrode 210 to define the pixels, that is, the light-emitting areas. The pixel defining layer 220 may include an organic material such as acryl resin, epoxy resin, phenolic resin, polyamide resin, and polyimide resin, and may perform the surface planarization function.

The organic layer 230 may be disposed on the first electrode 210 and the pixel defining layer 220. As shown in FIG. 6, the organic layer 230 may include a hole injection layer HIL, a first hole transport layer HTL1, a first electron blocking layer EBL1, a charge generation layer CGL, a second hole transport layer HTL2, a second electron blocking layer EBL2, a buffer layer BUL, and a second electron transport layer ETL2. A first lower light-emitting layer EML1 may be disposed between the first electron blocking layer EBL1 and the charge generation layer CGL and in the first light-emitting area LA1. A first upper light-emitting layer EML1' may be disposed between the second electron blocking layer EBL2 and the second electron transport layer ETL2 and in the first light-emitting area LA1. A second lower light-emitting layer EML2 may be disposed between the first electron blocking layer EBL1 and the charge generation layer CGL and in the second light-emitting area LA2. A second upper light-emitting layer EML2' may be disposed between the second electron blocking layer EBL2 and the second electron transport layer ETL2 and in the second light-emitting area LA2. A third lower light-emitting layer EML3 may be disposed between the first electron blocking layer EBL1 and the charge generation layer CGL in the third light-emitting area LA3. A third upper light-emitting layer EML3' may be disposed between the second electron blocking layer EBL2 and the second electron transport layer ETL2 in the third light-emitting area LA3. Each of the remaining layers except for the lower light-emitting layers EML1, EML2, EML3 and the upper light-emitting layers EML1', EML2', and EML3' may act a common layer extending along the plurality of light-emitting areas LA1, LA2, and LA3.

A second electrode 280 may be disposed on the organic layer 230. The second electrode 280 may be formed to cover the organic layer 230. The second electrode 280 may act as a cathode electrode for injecting electrons into the pixels, and may be a common layer to the pixels. When the second electrode 280 is made of a semi-transmissive metal material, light output efficiency may be increased due to a micro cavity.

As described above, the display device 1 may include the thin-film transistor layer TFTL and the light-emitting element layer EDL.

In one example, in this embodiment, a partitioning wall BR may be disposed between adjacent ones of the light-emitting areas LA1, LA2, and LA3.

Continuing to refer to FIGS. 8 to 11, a plurality of partitioning walls BR may be disposed on a portion of the planarization layer 200 overlapping the non-light-emitting area NLA. Each of the partitioning walls BR may include a second metal layer MTL2 and a first conductive layer 260 disposed on the second metal layer MTL2.

The second metal layer MTL2 may be directly disposed on the planarization layer 200 and in the non-light-emitting area NLA, and may include the same material as that of the first metal layer MTL1 as described above. The second metal layer MTL2 may constitute the lowermost portion of the partitioning wall BR.

The first conductive layer 260 may be disposed on the second metal layer MTL2. Thus, each of the partitioning walls BR may have the same stack structure as that of the first electrode 210 as described above, and be made of the same material as that of the first electrode 210 as described above. Specifically, the first conductive layer 260 may include a second lower layer 261, a second middle layer 263 disposed on the second lower layer 261, and a second upper layers 265 disposed on the second middle layer 263. The second lower layer 261 may include the same material as that of the first lower layer 211. The second middle layer 263 may include the same material as that of the first middle layer 213. The second upper layer 265 may include the same material as that of the first upper layer 215.

The above-described partitioning wall BR may have an undercut structure. An "undercut," as used herein, refers to the presence of a top layer that extends beyond an edge of a bottom layer. Specifically, the second metal layer MTL2 and the first conductive layer 260 may constitute an undercut structure. The second metal layer MTL2 may have an undercut shape under the first conductive layer 260. A width of the first conductive layer 260 in the first direction DR1 in a plan view may be greater than a width in the first direction DR1 of the second metal layer MTL2 in a plan view. At least one side of the first conductive layer 260 may extend beyond one side of the second metal layer MTL2 covering the first conductive layer 260.

In the embodiment of FIG. 9, one side of the first conductive layer 260 of the partitioning wall BR adjacent to the first light-emitting area LA1 extends in the first direction DR1 beyond one side of the second metal layer MTL2. In particular, the first conductive layer 260 may extend beyond the edge of the second metal layer MTL2 toward the first conductive layer 260 of the adjacent partitioning wall BR, forming an undercut. Hence, the first conductive layer 260 of the partitioning wall BR adjacent to the second light-emitting area LA2 may protrude in a direction opposite and parallel to the direction in which the first conductive layer 260 of the adjacent partitioning wall BR protrudes.

In some embodiments, each partitioning wall BR may have one side adjacent to each of the light-emitting areas LA1 and LA2 which may be aligned with one side of the second metal layer MTL2 in the third direction DR3.

An organic layer pattern 235 may be disposed on a portion of the planarization layer 200 between the partitioning walls BR adjacent to each other. A second electrode pattern 285 may be disposed on the organic layer pattern 235.

The organic layer pattern 235 may be formed by allowing at least a portion of the organic layer 230 to be discontinuous due to the undercut structure of the partitioning walls BR. The second electrode pattern 285 may be formed by allowing at least a portion of the second electrode 280 to be discontinuous due to the undercut structure of the partitioning walls BR. That is, at least a portion of a combination of the organic layer 230 and the second electrode 280 between the adjacent partitioning walls BR may be discontinuous between adjacent ones of the light-emitting area LA1, LA2, and LA3. The second electrode pattern 285 may be disposed to cover the organic layer pattern 235. A width in the first direction DR1 of each of the organic layer pattern 235 and the second electrode pattern 285 may be equal to or greater than a spacing between respective first conductive layers 260 of the partitioning walls BR adjacent to each other. "Discontinuous," as used herein, indicates that there is a break or a gap in the formation of a layer.

The organic layer pattern 235 may include the hole injection layer HIL, the first hole transport layer HTL1, the first electron blocking layer EBL1, the charge generation layer CGL, the second hole transport layer HTL2, the second electron blocking layer EBL2, the buffer layer BUL, and the second electron transport layer ETL2 of the organic layer 230. Due to the undercut structure of the partitioning wall BR, at least a portion of each of the hole injection layer HIL, the first hole transport layer HTL1, the first electron blocking layer EBL1, the charge generation layer CGL, the second hole transport layer HTL2, the second electron blocking layer EBL2, the buffer layer BUL, and the second electron transport layer ETL2 of the organic layer pattern 230 may be discontinuous between the partitioning walls BR. In particular, a portion of the charge generation layer CGL may be discontinuous between the partitioning walls BR.

In this embodiment, the partitioning walls BR of the undercut structure may be formed between adjacent ones of the light-emitting areas LA1, LA2, and LA3, and thus at least a portion of the combination of the organic layer 230 and the second electrode 280 may be discontinuous between the partitioning walls BR of the undercut structure. Especially, the charge generation layer CGL of the organic layer 230 may allow the charges to be transferred between adjacent pixels. Thus, in order to prevent this transfer, at least a portion of the charge generation layer CGL may be discontinuous between adjacent ones of the light-emitting areas such that resistance of the charge generation layer CGL may increase. Accordingly, the transfer of the charges between the adjacent pixels via the charge generation layer CGL may be reduced, thereby improving gray level displaying and reducing the color mixing.

Even when at least portion of the combination of the organic layer 230 and the second electrode 280 is discontinuous between the partitioning walls BR, light emission may be achieved via normal operation because the organic layer 230 and the second electrode 280 are continuous between adjacent ones of the light-emitting areas LA1, LA2, and LA3 and on an upper side and a lower side of each of the partitioning walls BR in a plan view as shown in FIG. 8.

Hereinafter, a method for manufacturing the above-described display device will be described.

FIG. 12 to FIG. 19 are cross-sectional views showing steps of a method for manufacturing a display device according to an embodiment.

FIGS. 12 to 19 may correspond to a cross-sectional view of the display device shown in FIG. 9 as described above. The material of each of the layers has been described above. Thus, in following descriptions of the manufacturing method, descriptions of the material of each of the layers will be omitted.

Figure 12:
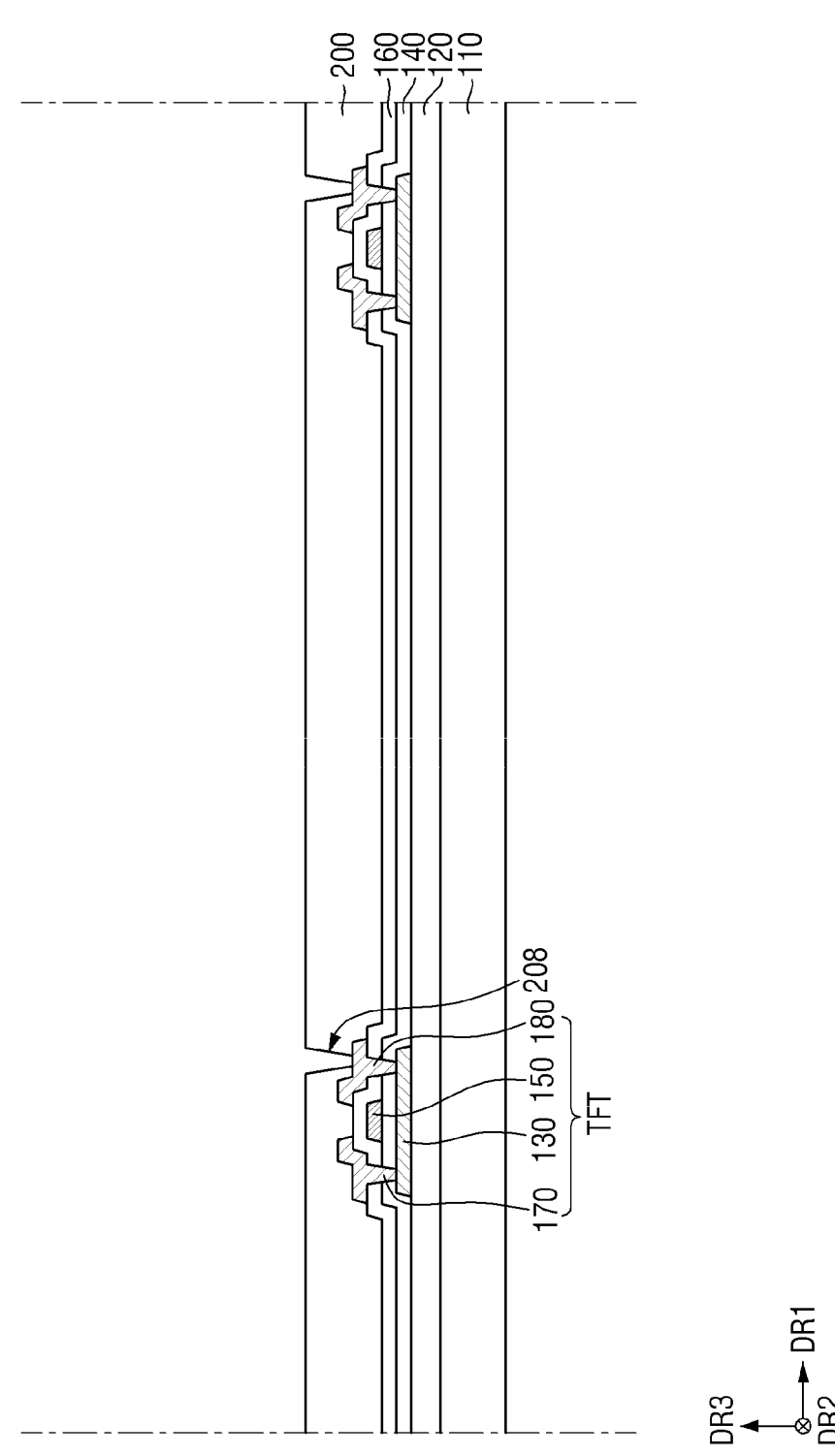

Referring to FIG. 12, the buffer film 120 is formed on the substrate 110, and the active layer 130 is formed on the buffer film 120. The active layer 130 may be formed using a mask process. For example, an oxide semiconductor or silicon may be deposited over an entire surface of the buffer film 120 and then patterned using a photolithography process to form the active layer 130 as shown in FIG. 12.

Next, the gate insulating layer 140 is formed on the active layer 130, and the gate electrode 150 overlapping the active layer 130 is formed on the gate insulating layer 140. The gate electrode 150 may be formed using a mask process. For example, a material layer for the gate electrode is deposited over an entire surface of the gate insulating layer 140. Then, a photoresist layer is applied on the material layer for the gate electrode, a photoresist pattern is formed using exposure and development, and the material layer for the gate electrode is etched using the photoresist pattern as an etching mask. Thereafter, the photoresist pattern may be removed using a strip or ashing process to form the gate electrode 150.

Next, the interlayer insulating layer 160 is formed on the gate electrode 150, and the source electrode 170 and the drain electrode 180 are formed on the interlayer insulating layer 160. The source electrode 170 and the drain electrode 180 may be formed using the above-described mask process. Before forming the source electrode 170 and the drain electrode 180, contact holes extending through the interlayer insulating layer 160 and the gate insulating layer 140 to expose a portion of the active layer 130 are formed. Thereafter, a source/drain electrode material layer is deposited on an entire surface of the interlayer insulating layer 160 and patterned using a photolithography process to form the source electrode 170 and the drain electrode 180. The source electrode 170 and the drain electrode 180 may be connected to the active layer 130 via the contact holes, respectively. Accordingly, the thin-film transistor TFT including the active layer 130, the gate electrode 150, the source electrode 170, and the drain electrode 180 is manufactured.

Next, the planarization layer 200 is formed on the source electrode 170 and the drain electrode 180. The planarization layer 200 may be formed by coating an organic material with a solution process, for example, a process such as spin coating. Then, the via hole 208 exposing a portion of the drain electrode 180 of the thin-film transistor TFT is formed using a photolithography process.

Figure 13:
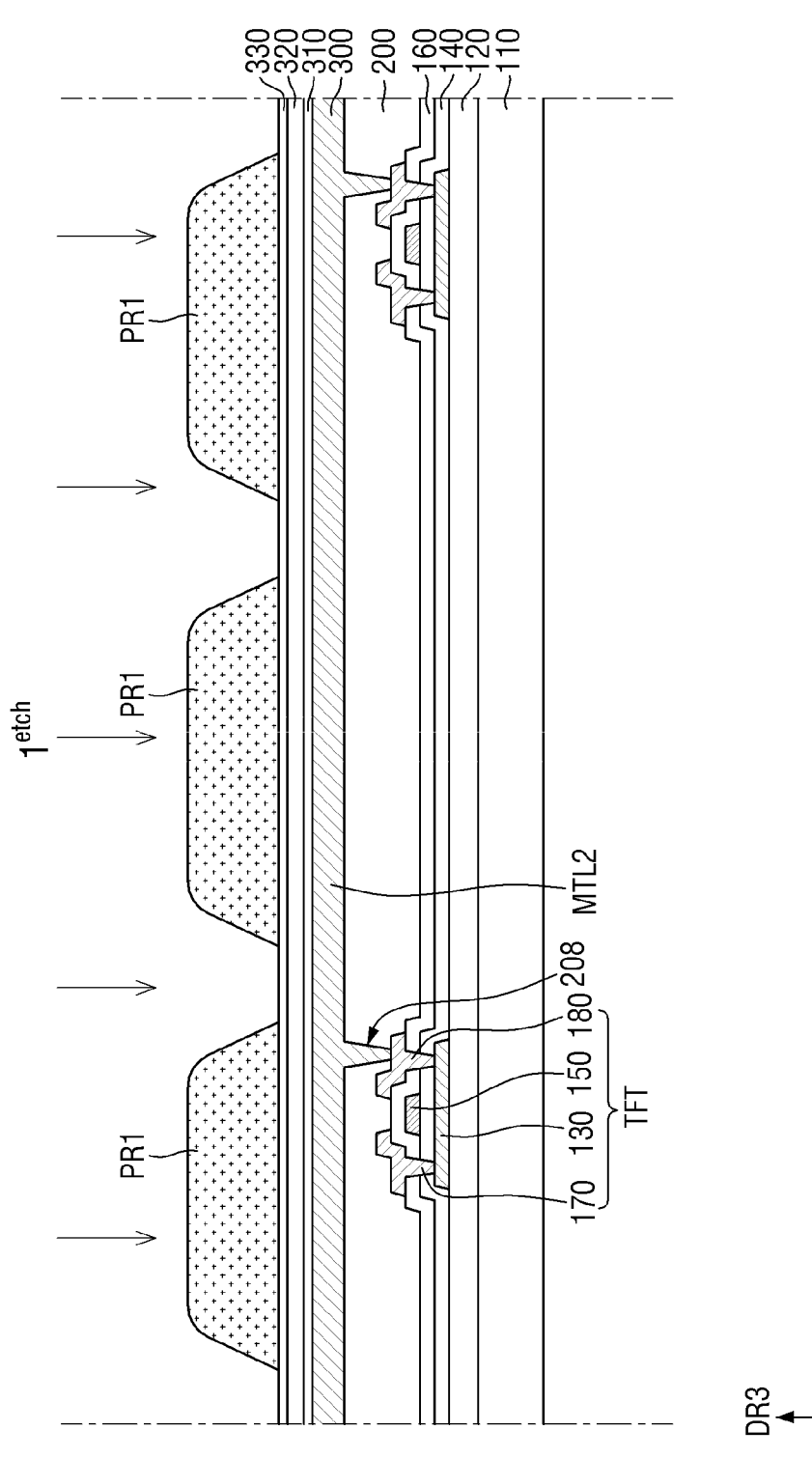

Next, referring to FIG. 13, a metal layer material layer 300, a lower layer material layer 310, a middle layer material layer 320, and an upper layer material layer 330 are sequentially stacked on the planarization layer 200 in this order. The metal layer material layer 300, the lower layer material layer 310, the middle layer material layer 320, and the upper layer material layer 330 may be formed using physical vapor deposition (PVD) or chemical vapor deposition (CVD).

Then, a photoresist is coated on the upper layer material layer 330 and a first photoresist pattern PR1 is formed using exposure and development. Then, a first etching process $(1^{etch})$ of etching the metal layer material layer 300, the lower layer material layer 310, the middle layer material layer 320, and the upper layer material layer 330 may be performed by spraying etching liquid thereto. The first etching process $(1^{etch})$ is performed in a batch manner using etching liquid capable of etching all of the metal layer material layer 300, the lower layer material layer 310, the middle layer material layer 320, and the upper layer material layer 330.

Figure 14:
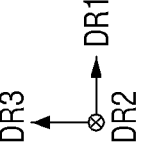

Next, referring to FIG. 14, the first metal layer MTL1 connected to the thin-film transistor TFT and the first electrodes 210 disposed on the first metal layer MTL1, and a partitioning wall pattern BRP disposed between the first electrodes 210 are formed using the first etching process $(1^{etch})$. In the first etching process $(1^{etch})$, the metal material layer 300 is converted into the first metal layer MTL1; and a combination of the lower layer material layer 310, the middle layer material layer 320, and the upper layer material layer 330 is converted into the first electrode 210. Further, in the first etching process $(1^{etch})$, the metal material layer 300 is converted into a second metal pattern 301 of the partitioning wall pattern BRP; and the lower layer material layer 310, the middle layer material layer 320 and the upper layer material layer 330 are converted into a lower layer pattern 311, a middle layer pattern 313 and an upper layer pattern 315 of the partitioning wall pattern BRP.

Next, a photoresist is coated on the first electrodes 210 and the partitioning wall pattern BRP, and is exposed and developed to form a second photoresist pattern PR2. The second photoresist pattern PR2 is formed to expose a portion of the partitioning wall pattern BRP. Then, a second etching $(2^{etch})$ for etching the second metal pattern 301, the lower layer pattern 311, the middle layer pattern 313, and the upper layer pattern 315 of the partitioning wall pattern (BRP) is executed by spraying etching liquid thereto. The second etching process $(2^{etch})$ is performed in a batch manner using etching liquid capable of etching all of the second metal pattern 301, the lower layer pattern 311, the middle layer pattern 313, and the upper layer pattern 315.

Figure 15:
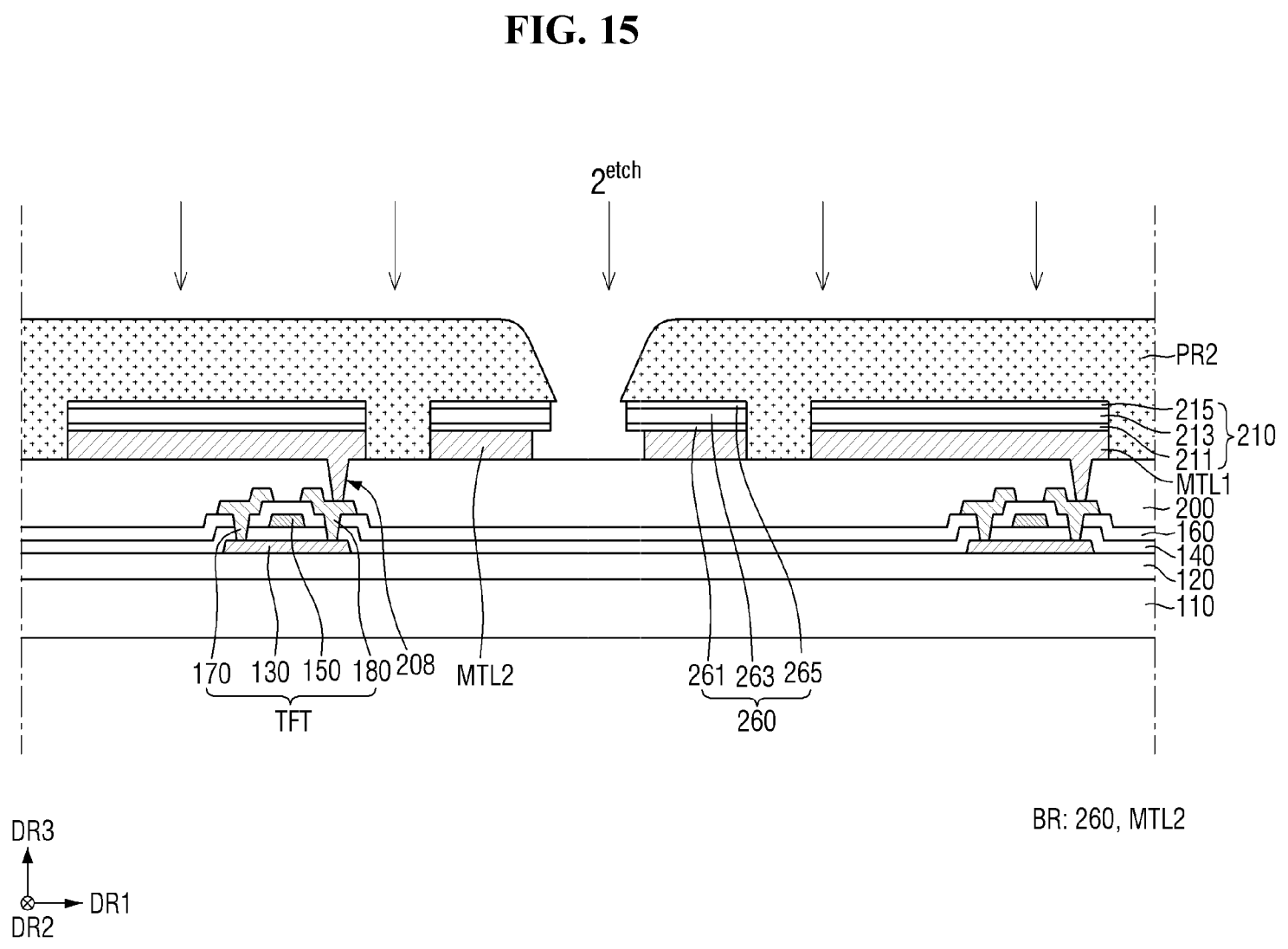
Figure 16:
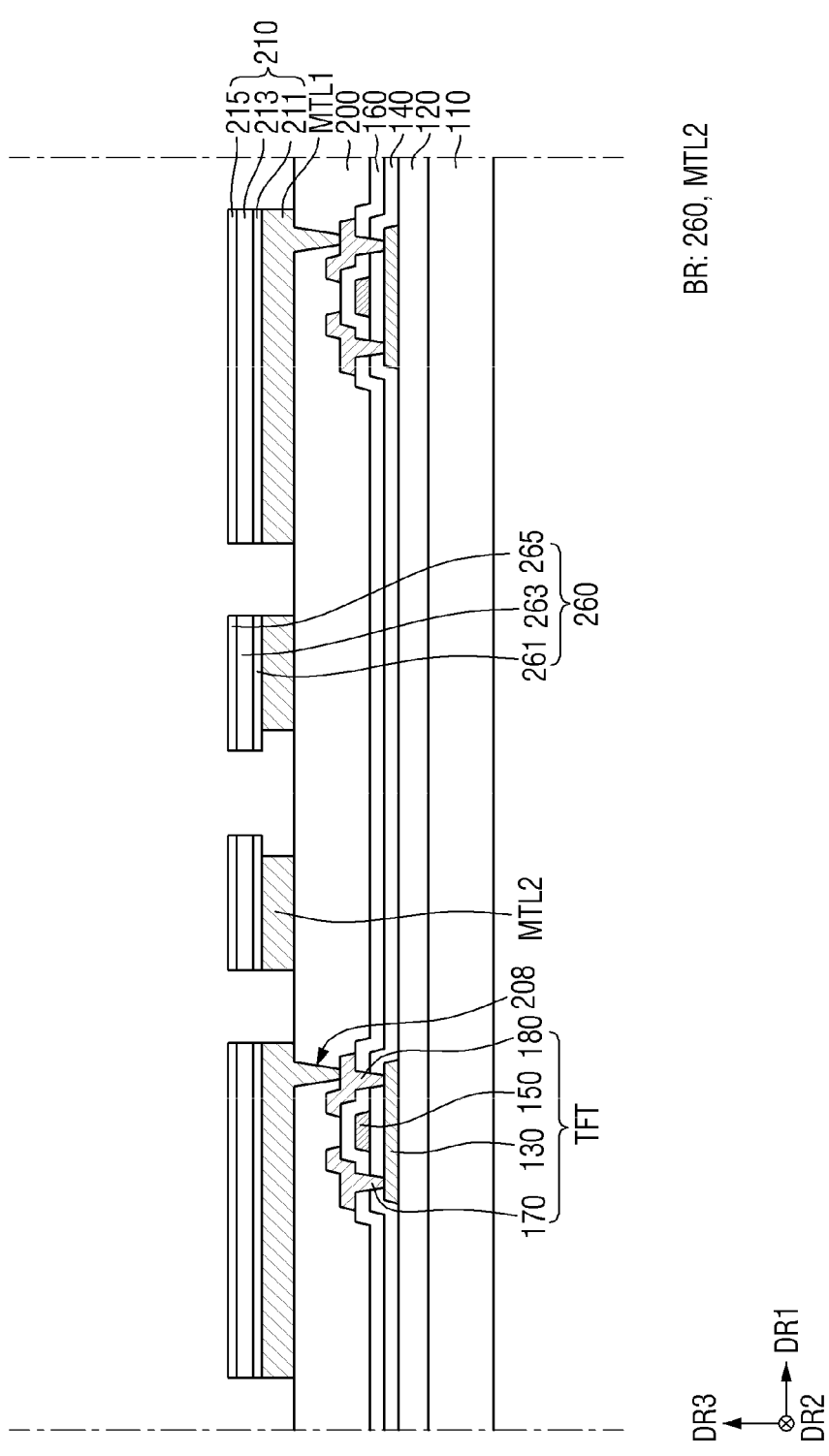

Referring to FIG. 15 and FIG. 16, the partitioning walls BR spaced apart from each other are formed using the second etching process $(2^{etch})$. In the second etching process $(2^{etch})$, the second metal pattern 301 is converted to the second metal layer MTL2; and a combination of the lower layer pattern 311, the middle layer pattern 313, and the upper layer pattern 315 is converted to the first conductive layer 260. Accordingly, each of the partitioning wall BR includes the second metal layer MTL2 and the first conductive layer 260 disposed on the second metal layer MTL2.

In some embodiments, when the second metal pattern 301, the lower layer pattern 311, the middle layer pattern 313 and the upper layer pattern 315 are etched using the same etching liquid, an etch rate of the second metal pattern 301 is higher than that of each of the lower layer pattern 311, the middle layer pattern 313 and the upper layer pattern 315. Thus, the second metal pattern 301 may be over-etched compared to the lower layer pattern 311, the middle layer pattern 313, and the upper layer pattern 315. In order to induce the over-etching of the second metal pattern 301, an injection time of the etching liquid and/or a concentration of the etching liquid may be adjusted. For example, the injection time of the etching liquid and the concentration of the etching liquid may increase compared to those in the first etching process $(1^{etch})$. Accordingly, the undercut structure may be formed in which one side of the first conductive layer 260 protrudes beyond an edge of the second metal layer MTL2.

Figure 17:
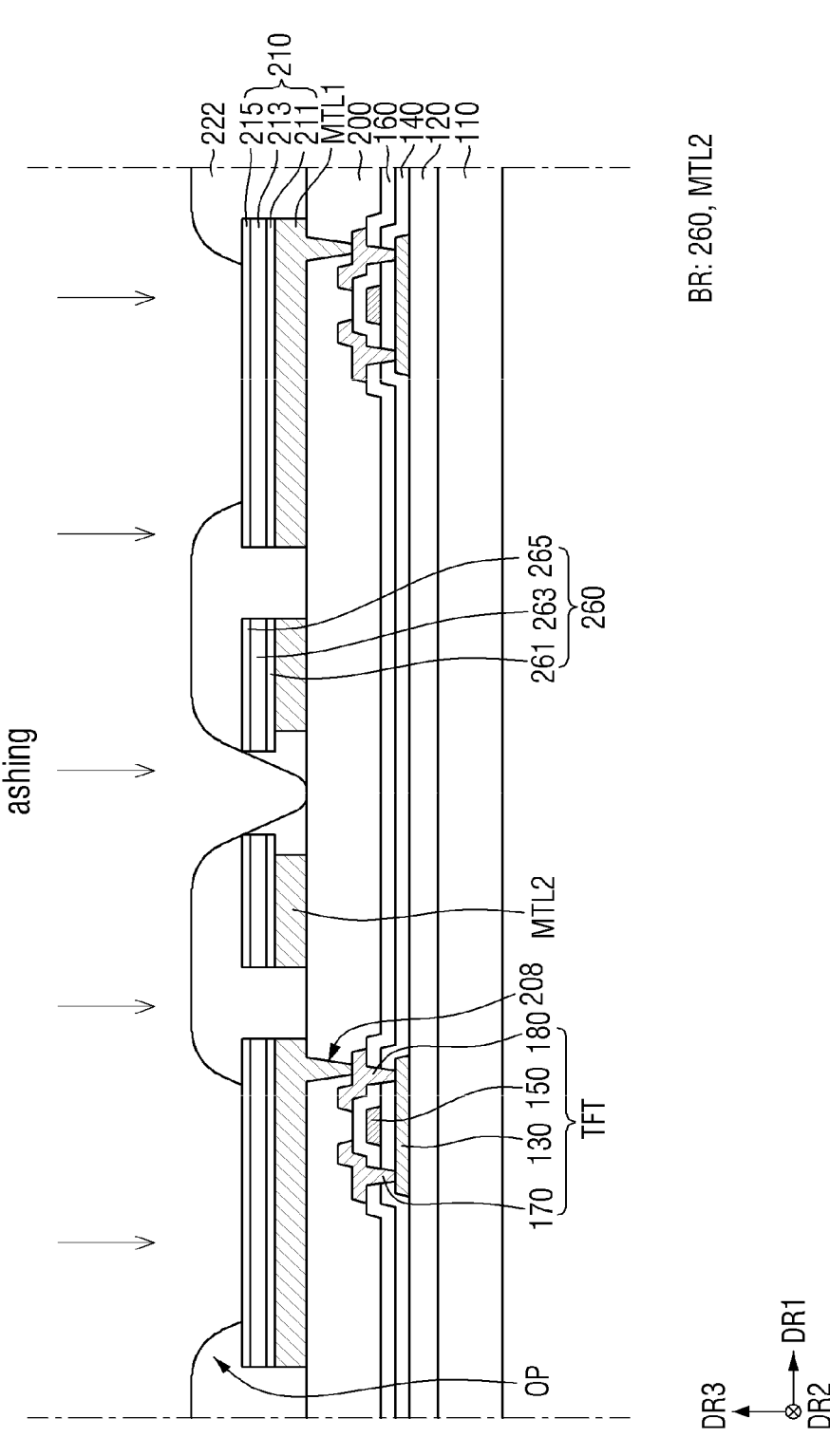
Figure 18:
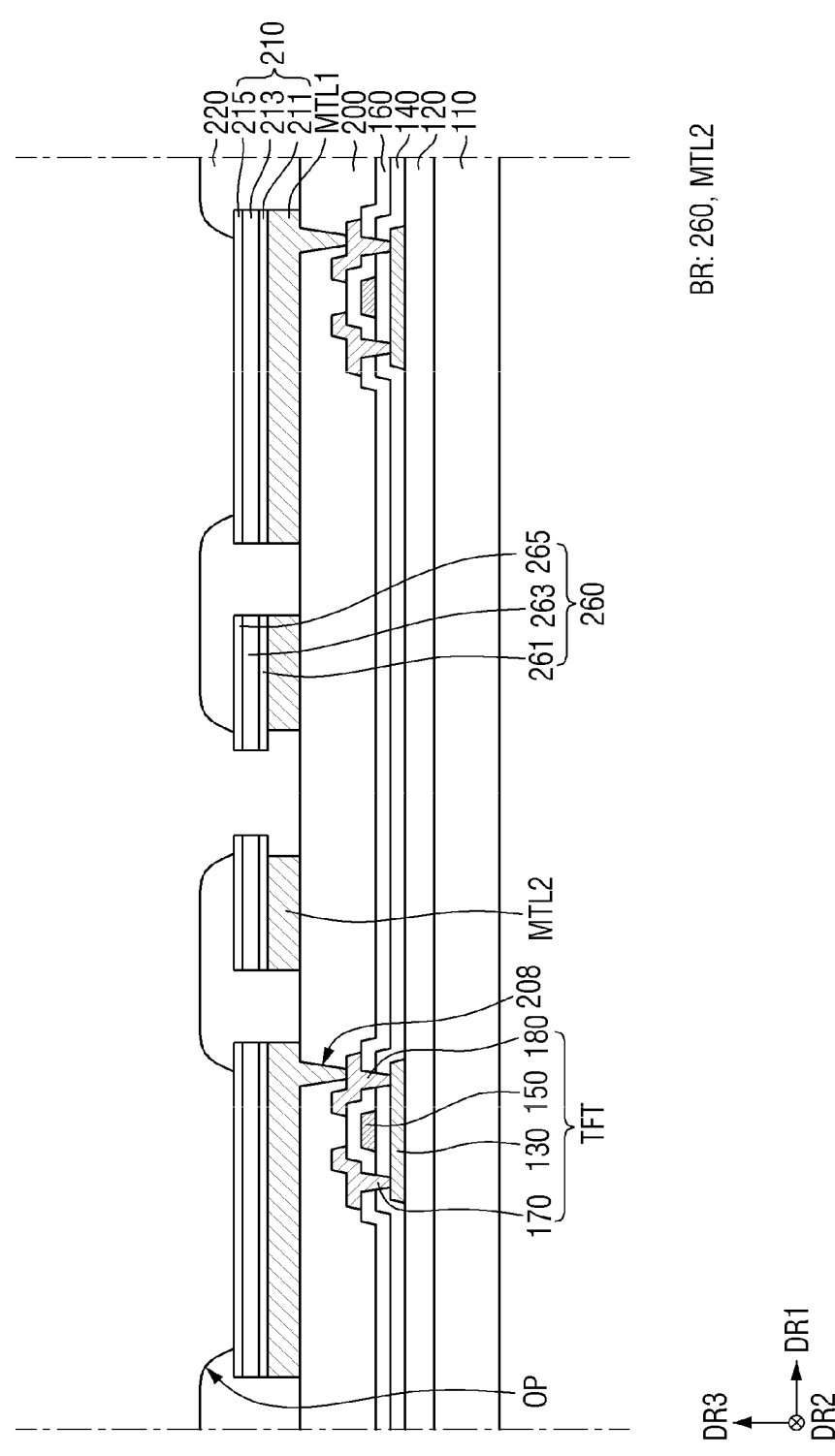

Next, referring to FIG. 17 and FIG. 18, a pixel defining layer material layer 222 is applied on the substrate 110, and an opening OP for exposing a portion of each of the first electrodes 210 is formed using a photolithography process. A partial area of the planarization layer 200 between the partitioning walls BR is exposed using a photolithography process.

Then, an ashing process is performed to remove the pixel defining layer material layer 222 remaining between the partitioning walls BR due to the undercut structure of the partitioning walls BR. An overall volume of the pixel defining layer material layer 222 may be reduced using the ashing process, and thus the pixel defining layer material layer 222 remaining between the partitioning walls BR may be removed. Although the drawings show that a portion of the pixel defining layer material layer 222 between the partitioning walls BR is entirely removed, the present disclosure is not limited thereto. The pixel defining layer material layer 222 may partially remain between neighboring partitioning walls BR. When the pixel defining layer material layer 222 partially remains between the partitioning walls BR, the pixel defining layer material layer 222 may contact a bottom face of the first conductive layer 260 and a side face of the second metal layer MTL2.

The pixel defining layer 220 disposed on the first electrode 210 and the partitioning walls BR may be formed using the ashing process. The pixel defining layer 220 fills a space between the first electrode 210 and the partitioning wall BR, but exposes an area between the partitioning walls BR to expose a portion of the planarization layer 200 between the partitioning walls BR.

Figure 19:
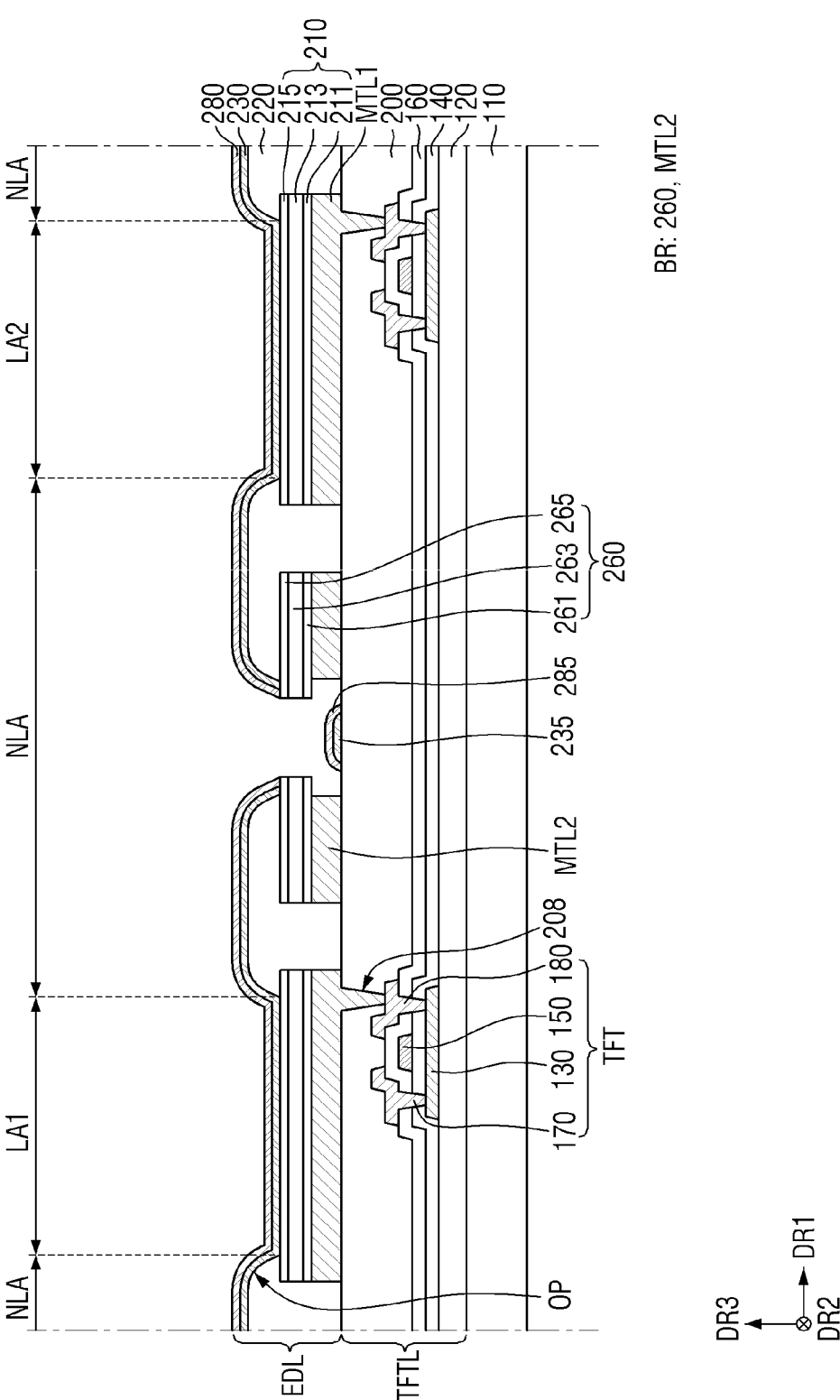

Next, referring to FIG. 19, the organic layer 230 is deposited on the pixel defining layer 220. The organic layer 230 may be formed over an entire face of the substrate 110 except for each of the light-emitting layers EML1, EML2, EML3, EML1', EML2', and EML3'. The organic layer 230 may be directly formed on the first electrode 210 in each of the light-emitting areas LA1 and LA2, and may be formed directly on the pixel defining layer 220 in the non-light-emitting area NLA. The organic layer 230 may be directly formed on the partitioning walls BR, but may be discontinuous between the partitioning walls BR due to the undercut structure of each of the partitioning walls BR. Accordingly, the organic layer 230 may be discontinuous between the partitioning walls BR due to the undercut structure of each of the partitioning walls BR. An organic layer pattern 235 as isolated due to the undercut structure of each of the partitioning walls BR may be directly disposed on a portion of the planarization layer 200 between the partitioning walls BR. Accordingly, the common layers including the charge generation layer CGL of FIG. 11 may be discontinuous between the partitioning walls BR due to the undercut structure of each of the partitioning walls BR.

Next, the second electrode 280 is formed on the organic layer 230. The second electrode 280 may be formed on an entire face of the organic layer 230. The second electrode 280 may be disposed on the organic layer 230, and may be discontinuous between the partitioning walls BR due to the undercut structure of each of the partitioning walls BR. Accordingly, the second electrode pattern 285 may be disposed on the organic layer pattern 235 between the partitioning walls BR. The second electrode pattern 285 may cover the organic layer pattern 235. The disclosure is not limited thereto.

Thus, the display device 1 according to an embodiment of the present disclosure may be manufactured. In this embodiment, when the second metal layer MTL2 and the first conductive layer 260 are etched using the same etching liquid, an etch rate of the second metal layer MTL2 is greater than an etch rate of the first conductive layer 260, thereby forming the partitioning wall BR having an undercut structure. In this embodiment, at least a portion of the organic layer 230, particularly, the charge generation layer CGL may be discontinuous, such that resistance of the charge generation layer CGL may be increased. Accordingly, transfer of the charges between adjacent pixels via the charge generation layer CGL may be reduced, thereby improving gray level displaying and reducing the color mixing of the display device 1.

Hereinafter, a display device according to another embodiment is disclosed.

In following descriptions, descriptions of the same configuration as that of the above-described embodiment will be omitted and differences therebetween will be described in detail.

Figure 20:
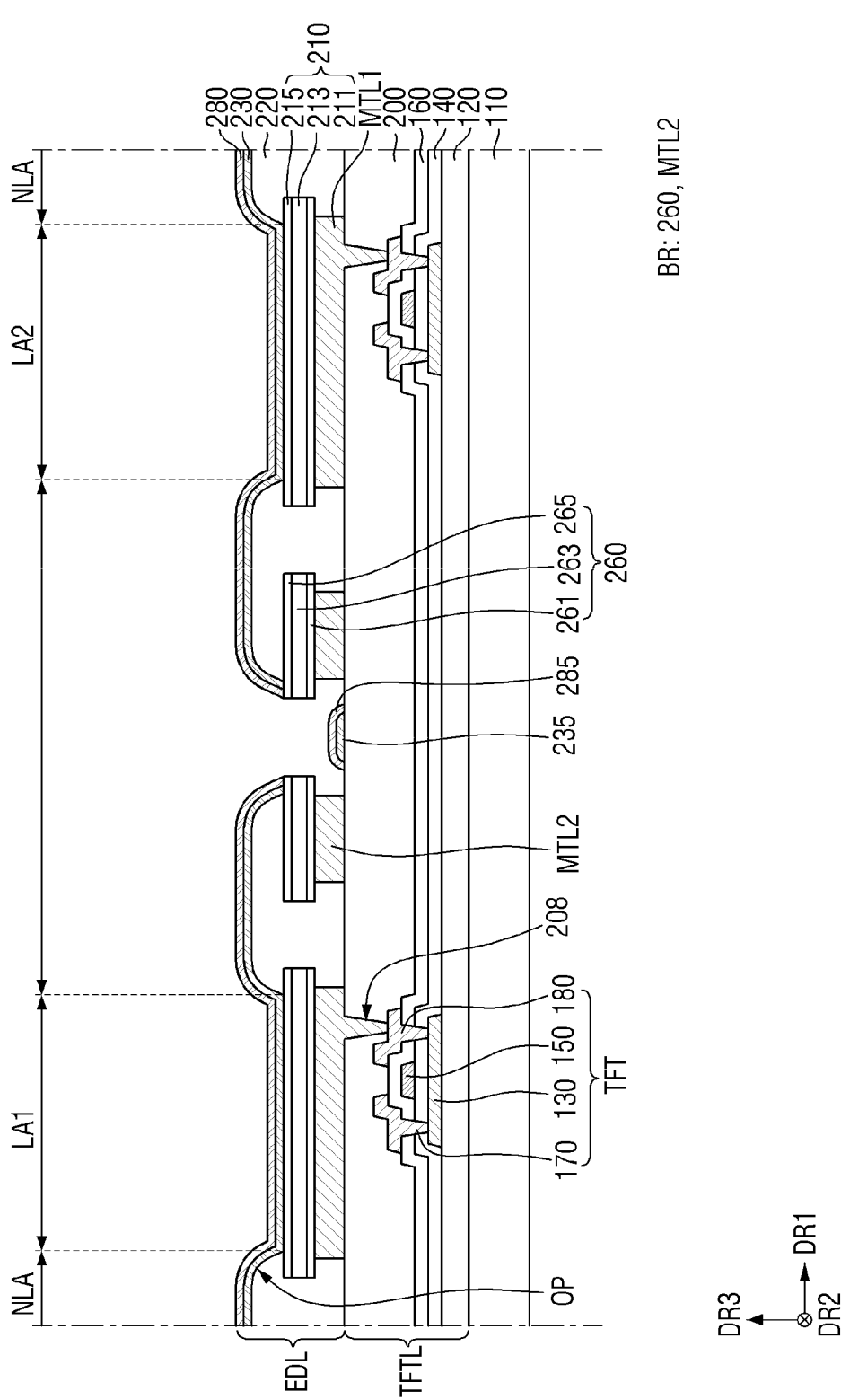
FIG. 20 is a cross-sectional view showing a display device according to another embodiment.
Figure 21:
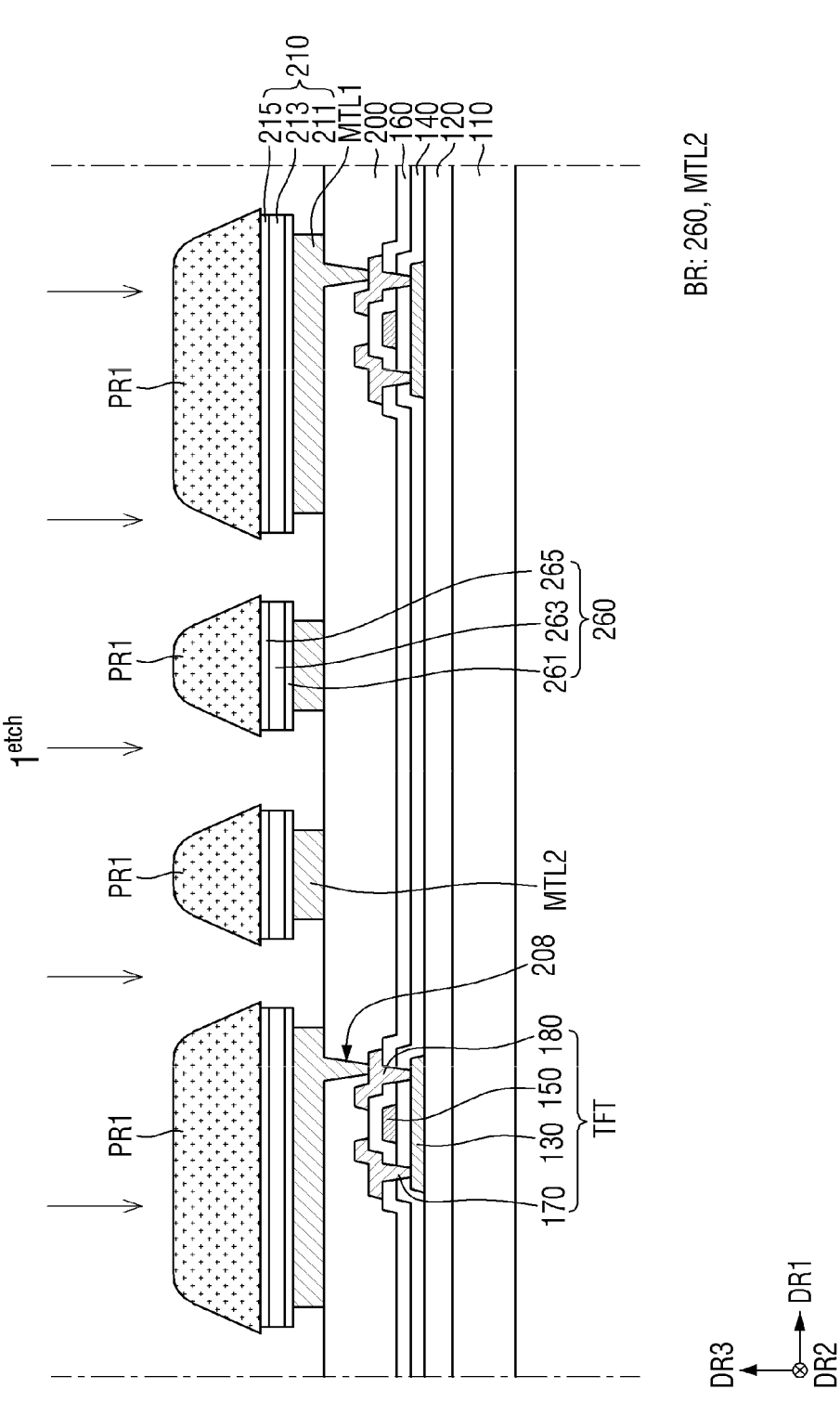
FIG. 21 is a cross-sectional view showing a method for manufacturing a display device according to another embodiment.

FIG. 20 is a cross-sectional view showing a display device according to another embodiment. FIG. 21 is a cross-sectional view showing a method for manufacturing a display device according to another embodiment.

Referring to FIG. 20, in this embodiment, the first metal layer MTL1 has an undercut beneath the first electrode 210, and each of a plurality of sides of each of the partitioning walls BR has an undercut structure.

Specifically, the first metal layer MTL1 has an under cut beneath the first electrode 210. A width of the first electrode 210 in the first direction DR1 in a plan view may be greater than a width in the first direction DR1 of the first metal layer MTL1. At least one side of the first electrode 210 may protrude outwardly beyond one side of the first metal layer MTL1 overlapping the first electrode 210.

In an embodiment, one side of the first electrode 210 disposed in the first light-emitting area LA1 may protrude in the first direction DR1 beyond an edge of the first metal layer MTL1. Further, the opposite side of the first electrode 210 may protrude in a parallel but opposite direction beyond the edge of the first metal layer MTL1. Although not shown, one side in the second direction DR2 of the first electrode 210 may protrude in the second direction DR2 beyond an edge of the first metal layer MTL1. The opposite side in the second direction DR2 of the first electrode 210 may protrude in a parallel but opposite direction beyond the opposite edge of the first metal layer MTL1. In some embodiments, each side of the first electrode 210 may protrude toward each of the adjacent partitioning walls BR. In other embodiments, all sides of the first electrode 210 may protrude beyond all sides of the first metal layer MTL1.

Further, the second metal layer MTL2 of the partitioning wall BR may have an undercut beneath the first conductive layer 260 of the partitioning wall BR. Sides of the first conductive layer 260 may protrude beyond sides of the second metal layer MTL2 that is covered by the first conductive layer 260.

In an exemplary embodiment, one side of the first conductive layer 260 of the partitioning wall BR adjacent to the first light-emitting area LA1 may protrude toward the first electrode 210 of the first light-emitting area LA1 adjacent thereto. The opposite side thereof may protrude toward the first conductive layer 260 of the adjacent partitioning wall BR. Further, one side in the second direction DR2 of the first conductive layer 260 may protrude in the second direction DR2 beyond an edge of the underlying second metal layer MTL2. The opposite side in the second direction DR2 of the first conductive layer 260 may protrude in a parallel but opposite direction beyond the opposite edge of the second metal layer MTL2.

One side of the first conductive layer 260 of the partitioning wall BR adjacent to the second light-emitting area LA2 may protrude toward the first electrode 210 of the second light-emitting area LA2 that is adjacently located. The opposite side of the same first conductive layer 260 may protrude toward the first conductive layer 260 of the adjacent partitioning wall BR. Further, one side in the second direction DR2 of the first conductive layer 260 may protrude in the second direction DR2 beyond an edge of the second metal layer MTL2. The opposite side of the first conductive layer 260 may protrude in the parallel but opposite direction beyond the edge of the second metal layer MTL2.

The above-described undercut structure of the first metal layer MTL1 beneath the first electrode 210 and the undercut structure of each of the plurality of sides of each of the partitioning walls BR may be formed as follows. Referring to FIG. 21, which will be described later, descriptions of the same steps thereof as those of the method for manufacturing in FIGS. 12 to 19 as described above will be omitted and differences therebetween will be described.

Referring to FIG. 21, as described above in FIG. 13, a metal layer material layer 300, a lower layer material layer 310, a middle layer material layer 320 and an upper layer material layer 330 are sequentially stacked on the planarization layer 200. Then, a first photoresist pattern PR1 is formed. In this case, the first photoresist pattern PR1 may be formed in positions corresponding to positions of the first electrodes 210 and the partitioning walls BR to be formed.

Then, a first etching process (1$^{etch}$) is performed to etch the metal layer material layer 300, the lower layer material layer 310, the middle layer material layer 320, and the upper layer material layer 330 by spraying etching liquid thereto. At this time, in the first etching process (1$^{etch}$), the metal layer material layer 300, the lower layer material layer 310, the middle layer material layer 320 and the upper layer material layer 330 may be batch-etched while an injection time of the etching liquid and a concentration of the etching liquid may be increased so that the metal layer material layer 300 is over-etched.

Accordingly, in the first etching process (1$^{etch}$), an undercut structure may be formed in which each side of the first electrode 210 extends beyond each corresponding edge of the first metal layer MTL1. Further, an undercut structure may be formed in which each of sides of the first conductive layer 260 of each of the partitioning walls BR extends beyond each edge of the second metal layer MTL2 that is underneath. Then, the process of FIG. 17 to FIG. 19 as described above may be performed. Thus, the display device according to another embodiment may be manufactured.

Figure 22:
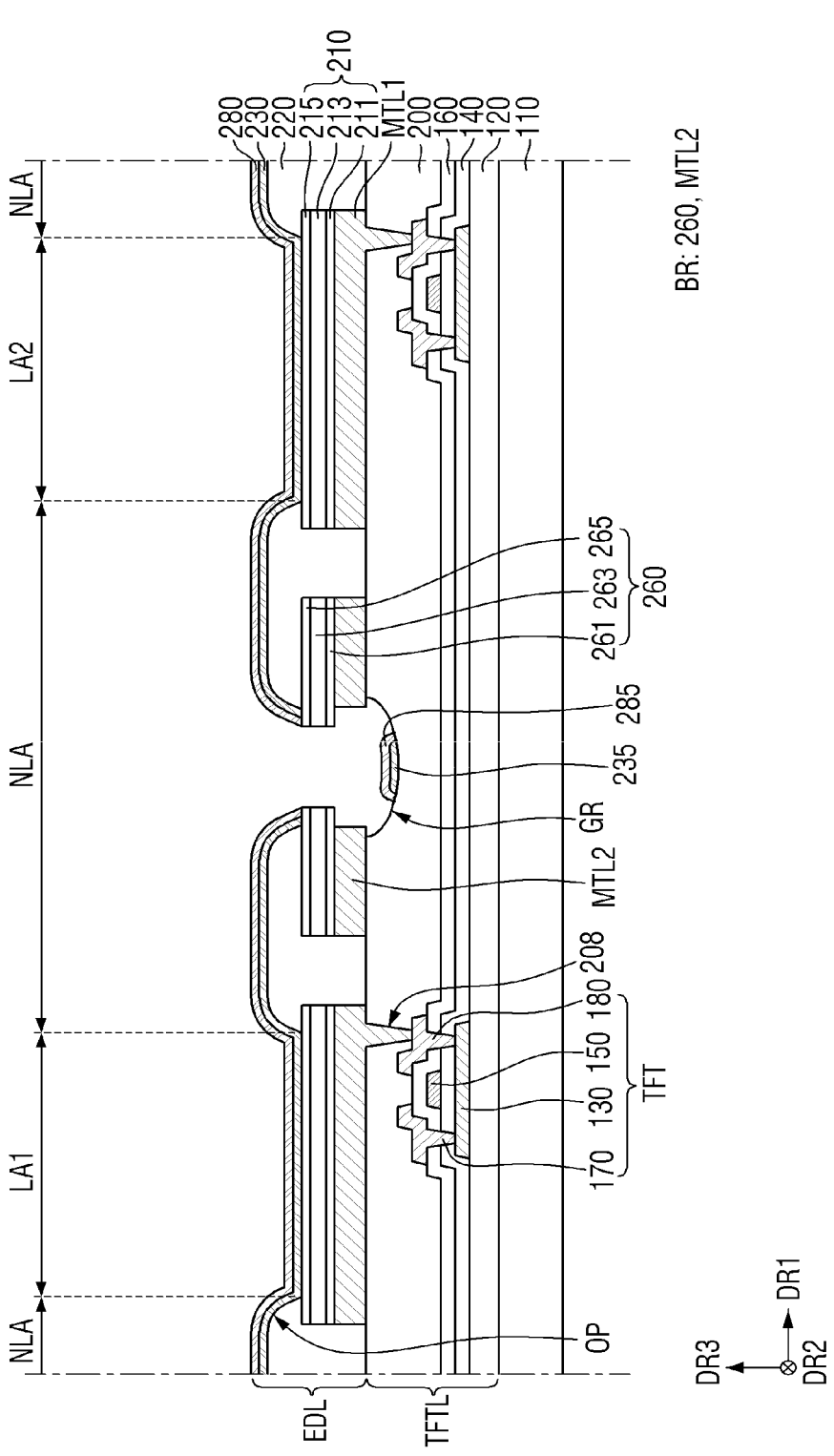
FIG. 22 is a cross-sectional view showing a display device according to still another embodiment.
Figure 23:
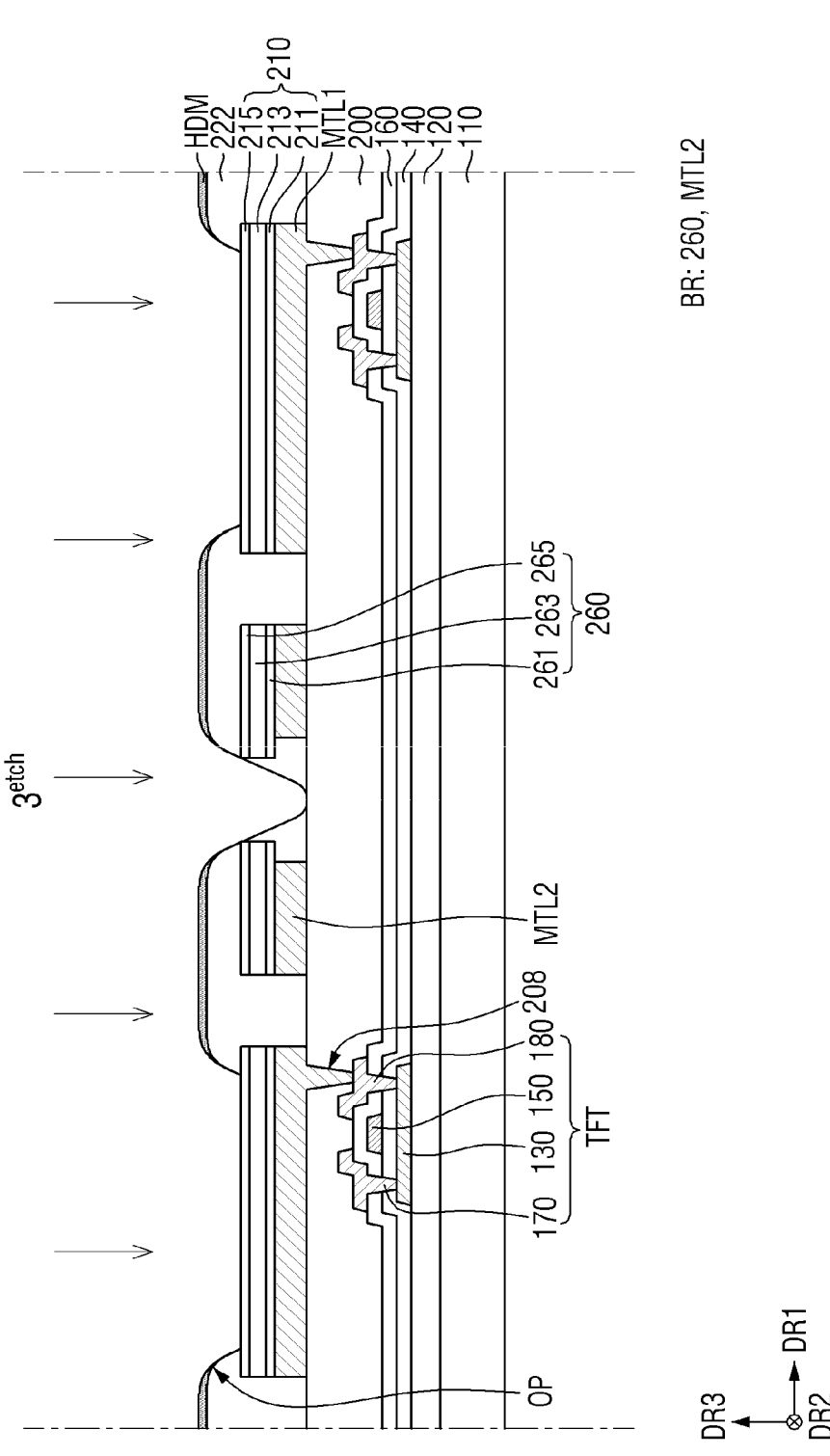
FIG. 23 and FIG. 24 are cross-sectional views showing steps of a method for manufacturing a display device according to still another embodiment.
Figure 24:
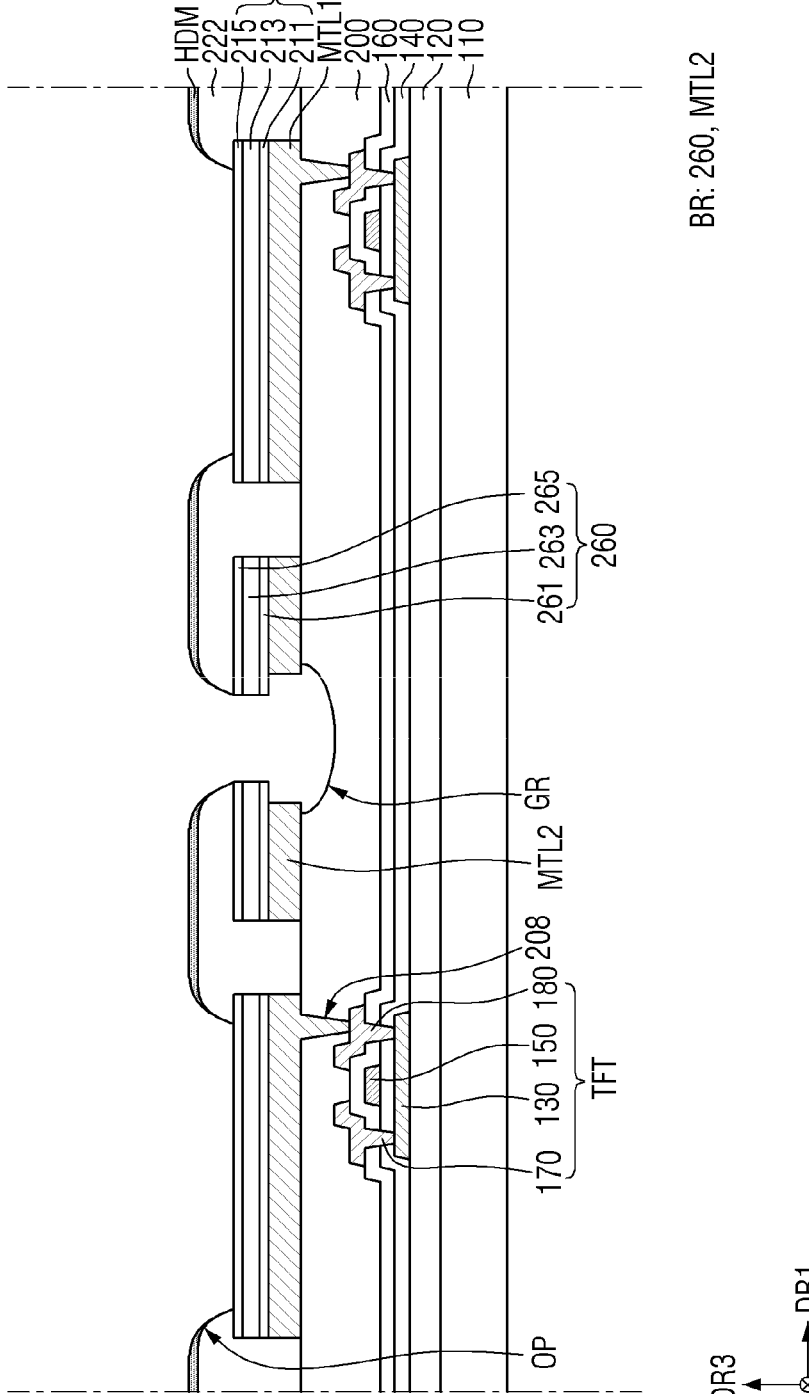

FIG. 22 is a cross-sectional view showing a display device according to yet another embodiment. FIG. 23 and FIG. 24 are cross-sectional views showing steps of a method for manufacturing the display device according to yet another embodiment.

Referring to FIG. 22, in this embodiment, a groove GR is defined in a portion of the planarization layer 200 between the partitioning walls BR. The groove GR may be formed on the surface of the planarization layer 200 that is closest to the second metal layer MTL2. The organic layer pattern 235 and the second electrode pattern 285 may be disposed on a bottom face of the groove OR.

Specifically, the groove GR may be defined in the planarization layer 200. The groove GR may be disposed between the partitioning walls BR. The groove GR may be recessed from a surface of the planarization layer 200 toward the substrate 110.

The groove OR may have a "width" in the first direction DR1 and a "length" in the second direction DR2. One side of the groove OR may contact the second metal layer MTL2 of the partitioning wall BR adjacent to the first light-emitting area LA1, and the opposite side of the groove OR may contact the second metal layer MTL2 of the partitioning wall BR adjacent to the second light-emitting area LA2. Accordingly, the "width" of the groove OR in the first direction DR1 may be defined as a distance between a portion of the second metal layer MTL2 of the partitioning wall BR adjacent to the first light-emitting area LA1 and a portion of the second metal layer MTL2 of the partitioning wall BR adjacent to the second light-emitting area LA2. In some embodiments, the width of the groove OR in the first direction DR1 may be greater than a distance between the first conductive layers 260 of the partitioning walls BR adjacent to each other. Further, in some embodiments, the width of the groove OR in the first direction DR1 may be greater than a distance between the second conductive layers MTL2 of the partitioning walls BR adjacent to each other.

The length in the second direction DR2 of the groove OR may be equal to a length in the second direction DR2 of each of the partitioning walls BR. However, the present disclosure is not limited thereto. The length of the groove OR in the second direction DR2 may be smaller than the length of each of the partitioning walls BR in the second direction DR2.

The organic layer pattern 235 and the second electrode pattern 285 may be disposed on the bottom face of the groove GR. The organic layer pattern 235 may be disposed directly on the bottom face of the groove OR. An edge of the second electrode pattern 285 may be directly disposed on the bottom face of the groove GR.

The above-described groove OR may be formed as follows. Referring to FIG. 23 and FIG. 24, which will be described later, descriptions of the steps that are described above will be omitted and differences therebetween will be described.

Referring to FIG. 23, as described above with reference to FIG. 17, the pixel defining layer material layer 222 is disposed on the substrate 110, and the opening OP for exposing a portion of each of the first electrodes 210 is formed using a photolithography process, and a partial area of the planarization layer 200 between the partitioning walls BR is exposed using a photolithography process.

Next, a third etching process (3$^{etch}$) is performed to remove the pixel defining layer material layer 222 remaining between the partitioning walls BR due to the undercut structure of each of the partitioning walls BR.

Specifically, a patterned hard mask layer HDM is formed on the pixel defining layer material layer 222. The patterned hard mask layer HDM may be formed using a mask process. For example, a hard mask material layer is deposited on an entire face of the pixel defining layer material layer 222, and is patterned using a photolithography process to form the patterned hard mask layer HDM as shown in FIG. 23. In one embodiment, the hard mask layer HDM may include a metal oxide such as indium-tin-oxide (ITO), indium-zinc-oxide (IZO), indium-gallium-zinc-oxide (IGZO), aluminum oxide (AlO$_x$), zirconium oxide (ZrO$_x$), and hafnium oxide (HfO$_x$). However, the hard mask layer HDM may include any material which has a lower etch rate during the etching process of the pixel defining layer material layer 222. In one embodiment, the hard mask layer HDM may be made of IZO.

Using the patterned hard mask layer HDM as an etching mask, a portion of the pixel defining layer material layer 222 between the partitioning walls BR is etched away and removed. The portion of the pixel defining layer material layer 222 between the partitioning walls BR may be removed via a dry etching process using the patterned hard mask layer HDM as an etching mask. The dry etching process may be isotropic etching, and may be performed using a reaction gas containing fluorine (F) and/or oxygen (O$_2$).

Referring to FIG. 24, the portion of the pixel defining layer material layer 222 between the partitioning walls BR may be removed using the dry etching process. Further, the groove GR having an undercut beneath each of the partitioning walls BR may be formed in the portion of the planarization layer 200 between the partitioning walls BR, and via the isotropic etching. The undercut amount, that is, a spacing between an inner circumferential surface of the groove GR and one side of the second metal layer MTL2 of each of the partitioning walls BR may vary by controlling a pressure and power of the dry etching process. Accordingly, the groove GR may be formed in the portion of the planarization layer 200 disposed between the partitioning walls BR. Then, the process of FIG. 19 as described above may be carried out. Thus, the display device according to still another embodiment may be manufactured.

Figure 25:
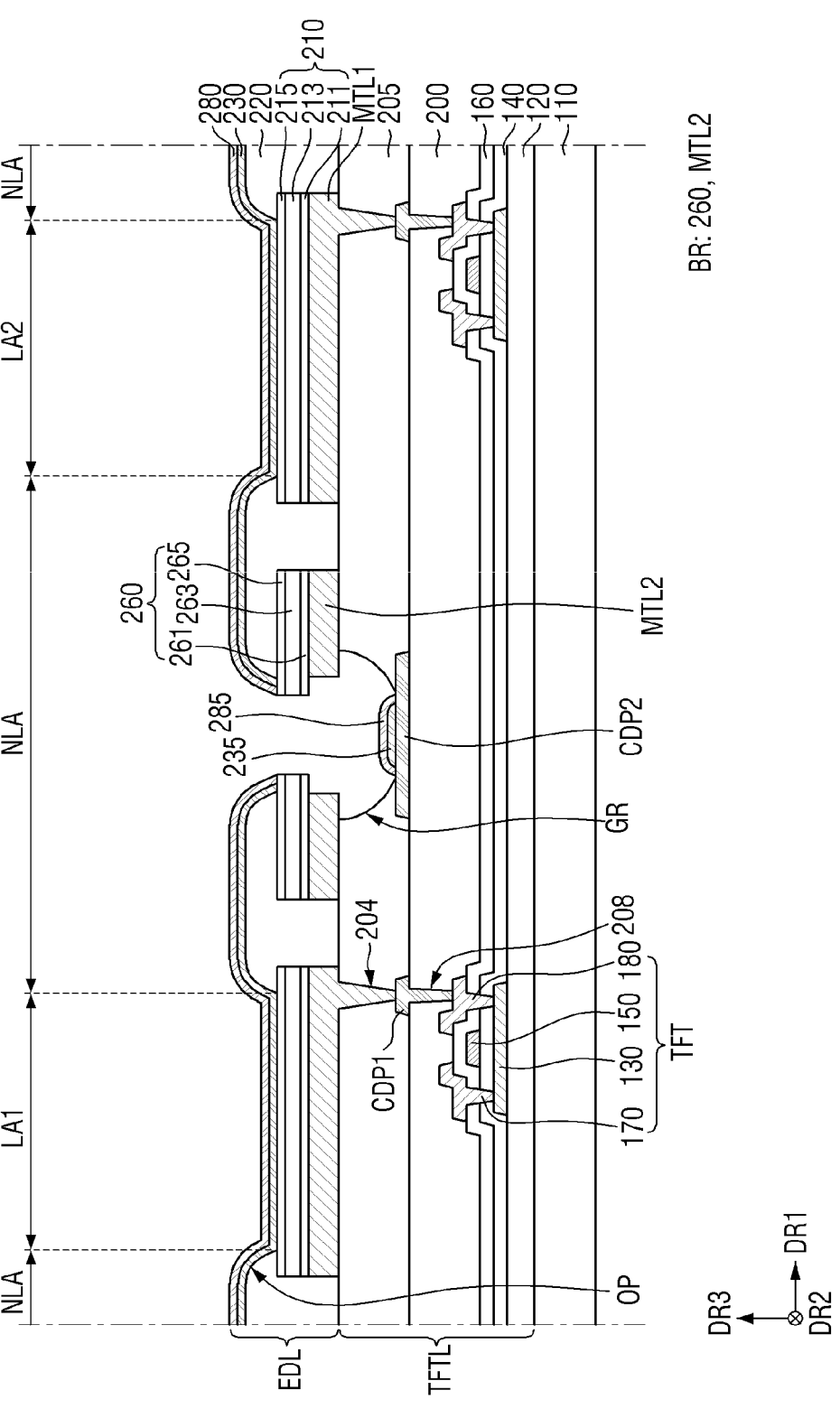
FIG. 25 is a cross-sectional view showing a display device according to still yet another embodiment.
Figure 26:
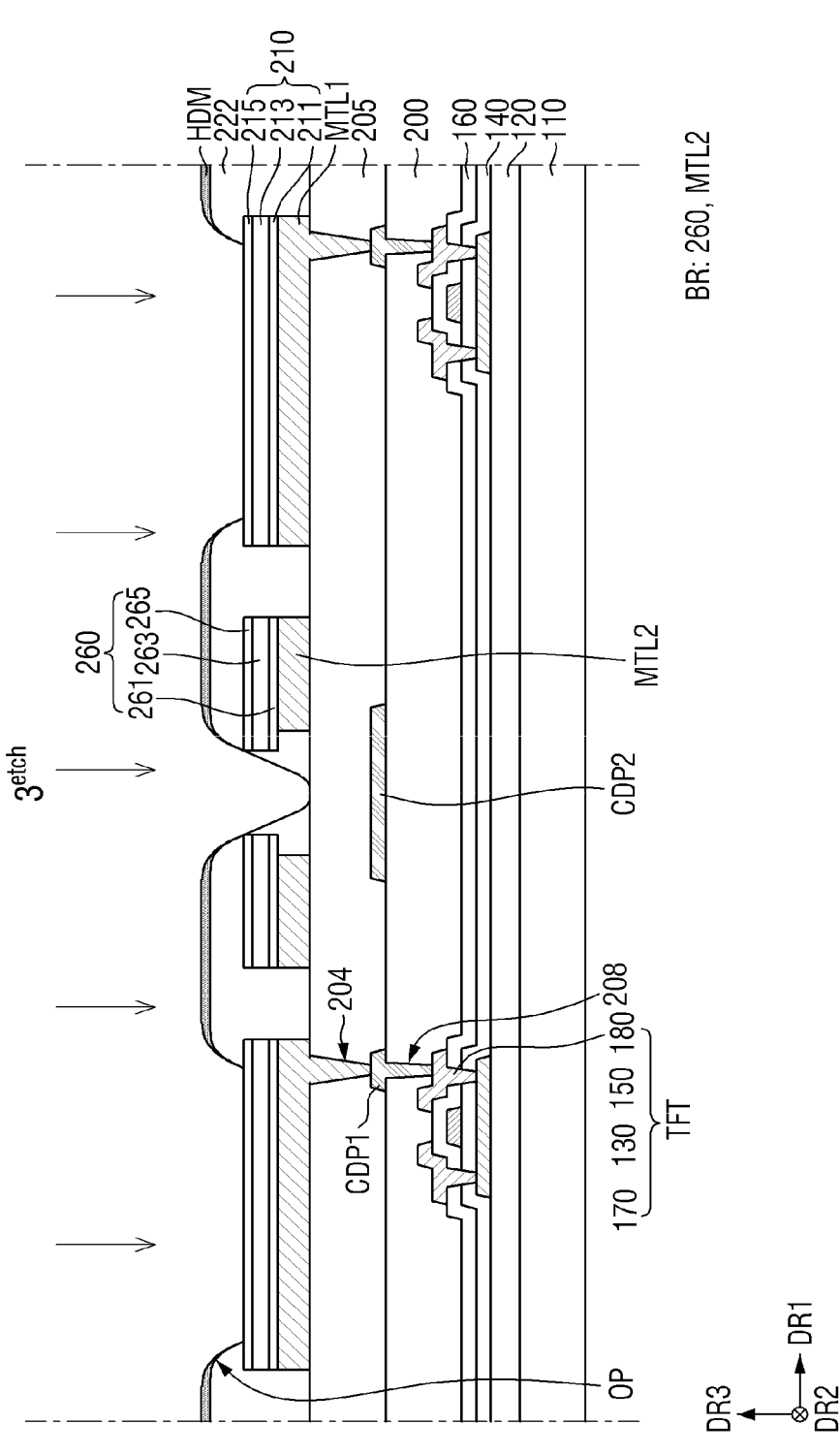
FIG. 26 and FIG. 27 are cross-sectional views showing steps of a method for manufacturing a display device according to still yet another embodiment.
Figure 27:
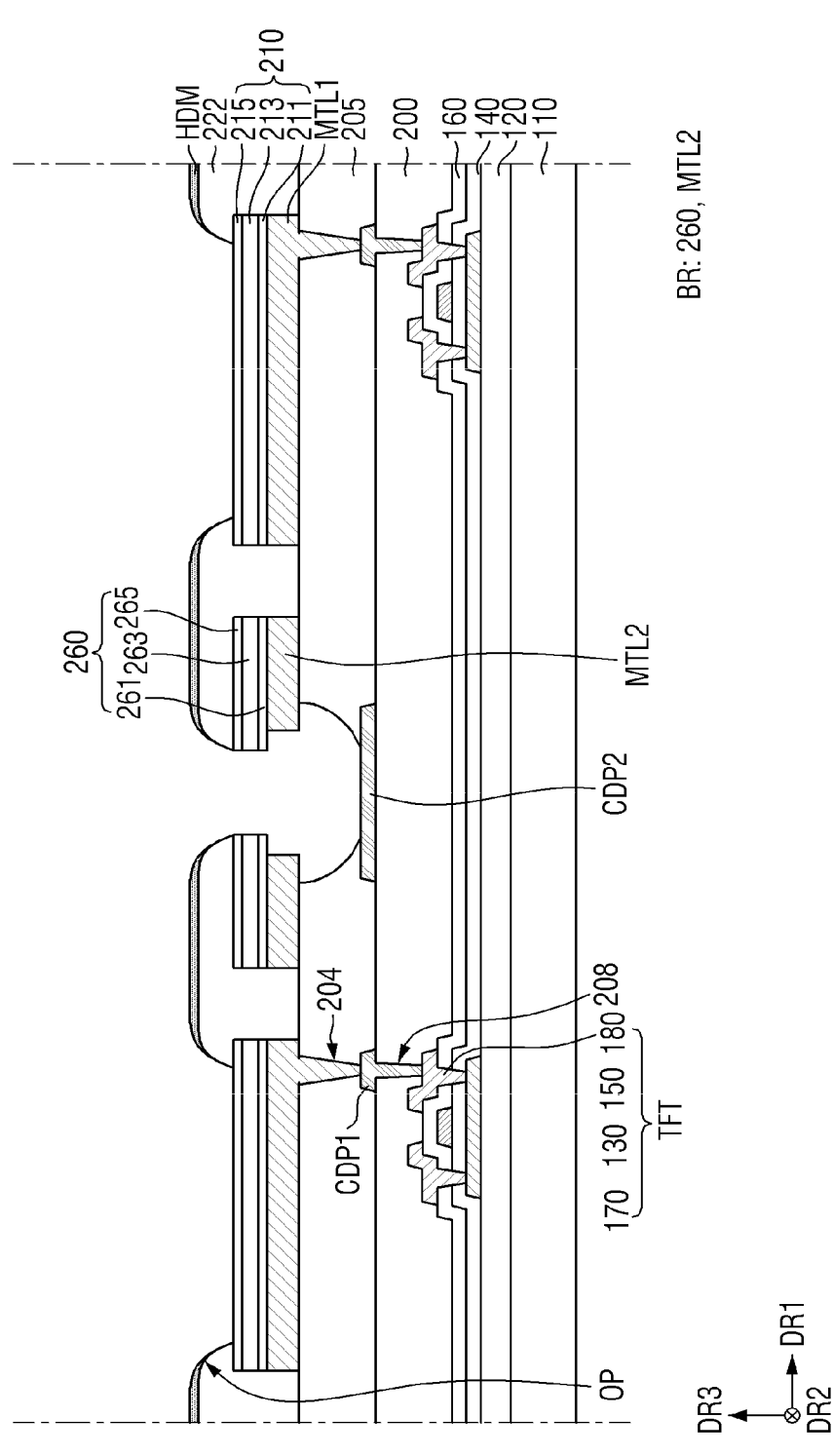

FIG. 25 is a cross-sectional view showing a display device according to still yet another embodiment. FIG. 26 and FIG. 27 are cross-sectional views showing steps of a method for manufacturing the display device according to yet another embodiment.

Referring to FIG. 25, this embodiment is different from the above-described embodiment of FIG. 22 in that a first conductive pattern CDP1 and a second conductive pattern CDP2 are disposed on the planarization layer 200, and a protective layer 205 is further disposed on the first conductive pattern CDP1 and the second conductive pattern CDP2.

Specifically, the first conductive pattern CDP1 and the second conductive pattern CDP2 may be disposed on the planarization layer 200 in which the via hole 208 has been formed. The first conductive pattern CDP1 may be connected to the drain electrode 180 of the thin-film transistor TFT via the via hole 208. The second conductive pattern CDP2 may be disposed in the non-light-emitting area NLA and may be disposed between the partitioning walls BR. Each of the first conductive pattern CDP1 and the second conductive pattern CDP2 may be islands. For example, the first conductive pattern CDP1 may be formed in an approximately circular shape to be connected to the first electrode 210, while the second conductive pattern CDP2 may be formed in a linear shape similar to each of the partitioning walls BR in order to prevent over-etching of a portion of the protective layer 205 between the partitioning walls BR.

The second conductive pattern CDP2 may be disposed between the partitioning walls BR, and at least a portion thereof may extend under the partitioning walls BR. The second conductive pattern CDP2 may have a "width" in the first direction DR1 and a "length" in the second direction DR2. One side of the second conductive pattern CDP2 may overlap the second metal layer MTL2 and the first conductive layer 260 of the partitioning wall BR adjacent to the first light-emitting area LA1. The opposite side of the second conductive pattern CDP2 may overlap the second metal layer MTL2 and the first conductive layer 260 of the partitioning wall BR adjacent to the second light-emitting area LA2. In some embodiments, the width of the second conductive pattern CDP2 in the first direction DR1 may be greater than a distance between the first conductive layers 260 of the partitioning walls BR adjacent to each other. Further, in some embodiments, the width of the second conductive pattern CDP2 in the first direction DR1 may be greater than a distance between the second conductive layers MTL2 of the partitioning walls BR adjacent to each other.

The length of the second conductive pattern CDP2 in the second direction DR2 may be equal to a length of each of the partitioning walls BR in the second direction DR2. However, the present disclosure is not limited thereto. The length of the second conductive pattern CDP2 in the second direction DR2 may be smaller than the length of each of the partitioning walls BR in the second direction DR2.

The protective layer 205 may be disposed on the first conductive pattern CDP1 and the second conductive pattern CDP2. The protective layer 205 may protect the first conductive pattern CDP1 and the second conductive pattern CDP2 and may planarize an underlying step. The protective layer 205 may include the same material as that of the planarization layer 200. The protective layer 205 may receive therein a contact hole 204 contacting the first conductive pattern CDP1 which thus may be connected to the first metal layer MTL1 via the contact hole 204. Accordingly, the first electrode 210 may be connected to the thin-film transistor TFT via the first metal layer MTL1 and the first conductive pattern CDP1.

The first metal layer MTL1 and the partitioning walls BR may be disposed on the protective layer 205. The first metal layer MTL1 may be disposed directly on the protective layer 205, and the second metal layer MTL2 of each of the partitioning walls BR may be directly disposed on the protective layer 205.

In one example, a groove GR may be defined in a portion of the protective layer 205 disposed between the partitioning walls BR. The groove OR may be the same as the groove OR of FIG. 22 as described above. However, in this embodiment, the groove OR may overlap the second conductive pattern CDP2, and may expose at least a portion of the second conductive pattern CDP2. The exposed portion of the second conductive pattern CDP2 may be the area near the center widthwise.

The organic layer pattern 235 and the second electrode pattern 285 may be disposed on the second conductive pattern CDP2 having at least a portion exposed through the groove GR. In the drawing, an entirety of the organic layer pattern 235 and a portion of the second electrode pattern 285 are directly disposed on and in contact with the second conductive pattern CDP2. The present disclosure is not limited thereto, and at least a portion of each of the organic layer pattern 235 and the second electrode pattern 285 may contact the second conductive pattern CDP2.

The second conductive pattern CDP2 may serve to prevent the planarization layer 200 from being etched in the same process as the third etching process ($3^{etch}$) of FIG. 23 as described above. To this end, the second conductive pattern CDP2 may include any material having a lower etch rate in the third etching process ($3^{etch}$) of etching the pixel defining layer material layer 222. For example, the second conductive pattern CDP2 may be made of aluminum (Al), molybdenum (Mo), titanium (Ti), ITO, IZO, or ITZO.

The first conductive pattern CDP1, the second conductive pattern CDP2, and the protective layer 205 as described above may be formed as follows. Referring to FIG. 26 and FIG. 27, which will be described later, descriptions of the steps already described above will be omitted and differences therebetween will be highlighted.

Referring to FIG. 26, as described above with reference to FIG. 12, the planarization layer 200 having a via hole 208 defined therein is formed. Next, a conductive pattern material layer is deposited on the planarization layer 200 and patterned using a photolithography process to form the first conductive pattern CDP1 filling the via hole 208 and the second conductive pattern CDP2 spaced apart therefrom. Next, the protective layer 205 is formed on the first conductive pattern CDP1 and the second conductive pattern CDP2, and a contact hole 204 exposing the first conductive pattern CDP1 is formed using a photolithography process.

Next, the first metal layer MTL1, the first electrode 210, and the partitioning walls BR are formed on the protective layer 205 using the process of FIGS. 13 to 17 as described above. Then, the pixel defining layer material layer 222 is applied on the substrate 110, and an opening OP exposing the first electrodes 210 is formed using a photolithography process, and a partial area of the protective layer 205 between the partitioning walls BR is exposed using a photolithography process.

Next, a third etching process $3^{etch}$ is performed to remove the pixel defining layer material layer 222 remaining between the partitioning walls BR due to the undercut structure of each of the partitioning walls BR. In the third etching process ($3^{etch}$) process, a patterned hard mask layer HDM is formed on the pixel defining layer material layer 222, and a portion of the pixel defining layer material layer 222 between the partitioning walls BR is etched and removed using the patterned hard mask layer HDM as an etching mask.

Referring to FIG. 27, the portion of the pixel defining layer material layer 222 between the partitioning walls BR may be removed using a dry etching process. Further, a groove GR having an undercut beneath each of the partitioning walls BR may be formed in a portion of the protective layer 205 between the partitioning walls BR via isotropic etching. The protective layer 205 is etched using the dry etching of the third etching process ($3^{etch}$) to form the groove GR, while etching of a portion of the planarization layer 200 may be prevented due to the second conductive pattern CDP2 disposed on the portion of the planarization layer 200. Because an etch rate of the second conductive pattern CDP2 is relatively much lower than that of each of the pixel defining layer material layer 222 and the protective layer 205, the etching of the underlying planarization layer 200 may be suppressed.

Then, the process of FIG. 19 as described above may be carried out. Thus, the display device according to still yet another embodiment may be manufactured.

Figure 28:
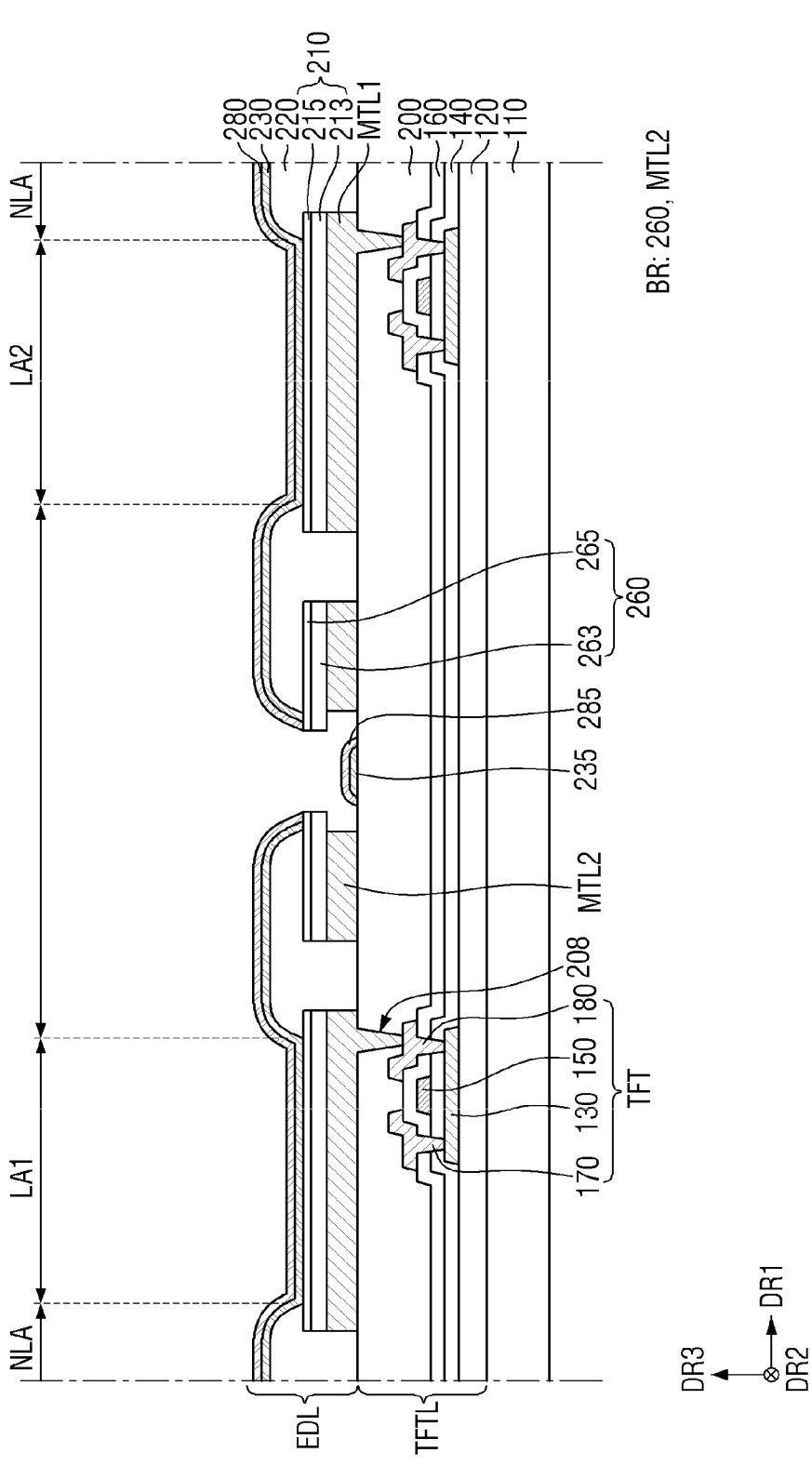
FIG. 28 is a cross-sectional view showing a display device according to still yet another embodiment.

FIG. 28 is a cross-sectional view showing a display device according to yet another embodiment.

Referring to FIG. 28, this embodiment is different from the embodiments of FIGS. 8 to 27 as described above in that each of the first electrode 210 and the first conductive layer 260 has a two-layer structure.

In this embodiment, the first electrode 210 is free of the first lower layer, and the first conductive layer 260 is free of the second lower layer, as compared with the above-mentioned embodiment such as what is depicted in FIG. 9.

Specifically, the first electrode 210 may include the first middle layer 213 and the first upper layer 215 disposed on the first middle layer 213. The first middle layer 213 may be directly disposed on and in contact with the underlying first metal layer MTL1.

The first conductive layer 260 may include the second middle layer 263 and the second upper layer 265 disposed on the second middle layer 263. The second middle layer 263 may be directly disposed on and in contact with the underlying second metal layer MTL2.

In the above embodiment, the first lower layer ("211" in FIG. 9) of the first electrode 210 may be disposed for imparting conductivity and adhesion with the underlying layer (e.g., planarization layer). However, in this embodiment, the first metal layer MTL1 having adhesion and conductivity may be disposed beneath the first electrode 210. Thus, the first lower layer may be omitted. Similarly, the second lower layer ("261" in FIG. 9) of the first conductive layer 260 may be omitted because the second metal layer MTL2 is disposed beneath the first conductive layer 260.

A following Table 1 shows simulation results of resistance of the second electrode, IR drop, and luminance distribution of a display device free of the partitioning walls and a display device having the partitioning walls.

TABLE 1

| | Without partitioning walls | With partitioning walls | Increase |
|---|---|---|---|
| Resistance of second electrode ($\Omega$) | 20 | 45.2 | 25.2 |
| IR drop (V) | 1.29 | 2.37 | 1.08 |
| Luminance distribution (%) | 85.8 | 84.9 | −0.9 |

Referring to the Table 1, in the display device including the partitioning walls, the resistance of the second electrode was increased by at least twofold, compared to that of the display device without the partitioning walls. Further, the IR drop was increased by 1.08V and the luminance distribution was decreased by 0.9%, compared to those of the display device without the partitioning walls.

Thus, in the device including the partitioning walls, substantially comparable display quality may be achieved due to the insignificant IR drop or luminance distribution. Further, the inclusion of the partitioning walls may significantly increase the resistance of the second electrode such that the leakage current may be reduced.

Those skilled in the art will appreciate that many variations and modifications can be made to the preferred embodiments without substantially departing from the principles of the present invention. Therefore, the disclosed embodiments of the concept are used in a descriptive sense only and not for purposes of limitation.

What is claimed is:

1. A display device comprising:
   a substrate;
   at least one thin-film transistor disposed on the substrate;
   a planarization layer disposed on the thin-film transistor;
   a first metal layer disposed on the planarization layer and connected to the thin-film transistor;
   a first electrode disposed on the first metal layer;
   partitioning walls disposed on the planarization layer and spaced apart from the first electrode, wherein each of the partitioning walls includes a second metal layer and a first conductive layer;
   a pixel defining layer disposed on the first electrode and the partitioning walls;
   an organic layer disposed on the first electrode and the pixel defining layer; and
   a second electrode disposed on the organic layer,
   wherein the second metal layer is disposed under the first conductive layer and has an undercut beneath the first conductive layer,
   wherein the organic layer is discontinuous between the partitioning walls, and
   wherein the partition walls include two partition walls disposed between two adjacent first electrodes, and the two partition walls respectively have undercuts on sides facing each other.

2. The device of claim 1, wherein the partitioning walls are arranged to outline parts of the first electrode in a plan view.

3. The device of claim 2, wherein each of the partitioning walls extends parallel to at least one side of the first electrode, wherein each of the partitioning walls is longer than at least one side of the first electrode adjacent thereto.

4. The device of claim 1, wherein the first metal layer is connected to the thin-film transistor, wherein the first electrode is disposed directly on the first metal layer.

5. The device of claim 1, wherein the second metal layer is disposed directly on the planarization layer, and includes the same material as a material of the first metal layer.

6. The device of claim 1, wherein the first electrode includes a first lower layer, a first middle layer disposed on the first lower layer, and a first upper layer disposed on the first middle layer, wherein the first conductive layer includes a second lower layer, a second middle layer disposed on the second lower layer, and a second upper layer disposed on the second middle layer, wherein the first lower layer and the second lower layer are made of the same material, the first middle layer and the second middle layer are made of the same material, and the first upper layer and the second upper layer are made of the same material.

7. The device of claim 6, wherein each of the first lower layer, the first upper layer, the second lower layer and the second upper layer includes a transparent conductive material, and each of the first middle layer and the second middle layer includes a metal material.

8. The device of claim 1, wherein an etch rate of the first metal layer is higher than an etch rate of the first electrode for a preselected etching liquid, and wherein an etch rate of the second metal layer is higher than an etch rate of the first conductive layer relative to the preselected etching liquid.

9. The device of claim 1, wherein the organic layer includes at least a charge generation layer, wherein an undercut shape of each of the partitioning walls allows at least portion of the charge generation layer to be discontinuous between the partitioning walls.

10. The device of claim 9, wherein each of the organic layer and the second electrode is on the first electrode, the pixel defining layer and the partitioning walls.

11. The device of claim 1, wherein the device further comprises:

an organic layer pattern disposed on the planarization layer and between the partitioning walls; and a second electrode pattern disposed on the organic layer pattern and between the partitioning walls.

12. The device of claim 1, wherein the first metal layer is disposed under the first electrode and has an undercut beneath the first electrode.

13. A display device comprising:

a substrate;

at least one thin-film transistor disposed on the substrate;

a planarization layer disposed on the thin-film transistor;

a first metal layer disposed on the planarization layer and connected to the thin-film transistor;

a first electrode disposed on the first metal layer;

partitioning walls disposed on the planarization layer and spaced apart from the first electrode, wherein each of the partitioning walls includes a second metal layer and a first conductive layer, a pixel defining layer disposed on the first electrode and the partitioning walls;

an organic layer disposed on the first electrode and the pixel defining layer; and a second electrode disposed on the organic layer, wherein the planarization layer has a groove defined therein, wherein the groove is disposed between the partitioning walls adjacent to each other, wherein the groove has an undercut portion beneath the second metal layer of each of the partitioning walls.

14. The device of claim 13, wherein the second metal layer is disposed under the first conductive layer and has an undercut beneath the first conductive layer, wherein at least a portion of the organic layer is discontinuous between the partitioning walls.

15. The device of claim 13, wherein the device further comprises:

an organic layer pattern disposed on the groove of the planarization layer, and a second electrode pattern disposed on the organic layer pattern.

16. A display device comprising:

a substrate;

at least one thin-film transistor disposed on the substrate;

a planarization layer disposed on the thin-film transistor;

a first conductive pattern and a second conductive pattern disposed on the planarization layer, a protective layer disposed on the first conductive pattern and the second conductive pattern;

a first metal layer disposed on the protective layer and connected to the thin-film transistor via the first conductive pattern;

a first electrode disposed on the first metal layer;

partitioning walls disposed on the protective layer, wherein each of the partitioning walls includes a second metal layer and a first conductive layer;

a pixel defining layer disposed on the first electrode and the partitioning walls;

an organic layer disposed on the first electrode and the pixel defining layer; and a second electrode disposed on the organic layer, wherein the protective layer has a groove defined therein, wherein the groove is disposed between the partitioning walls adjacent to each other, wherein the groove has an undercut portion beneath the second metal layer of each of the partitioning walls, wherein the groove vertically overlaps the second conductive pattern.

17. The device of claim 16, wherein the groove exposes at least a portion of the second conductive pattern, wherein the second metal layer of each of the partitioning walls is disposed under the first conductive layer and has an undercut beneath the first conductive layer.

18. The device of claim 17, wherein the device further comprises:

an organic layer pattern disposed on the second conductive pattern; and a second electrode pattern disposed on the organic layer pattern.

19. The device of claim 18, wherein at least portion of each of the organic layer and the second electrode is discontinuous between the partitioning walls, wherein the organic layer pattern and the organic layer include the same material, and wherein the second electrode and the second electrode pattern include the same material.

20. An electronic device comprising:

a substrate;

at least one thin-film transistor disposed on the substrate;

a planarization layer disposed on the thin-film transistor;

a first metal layer disposed on the planarization layer and connected to the thin-film transistor;

a first electrode disposed on the first metal layer;

partitioning walls disposed on the planarization layer and spaced apart from the first electrode, wherein each of the partitioning walls includes a second metal layer and a first conductive layer;

a pixel defining layer disposed on the first electrode and the partitioning walls;

an organic layer disposed on the first electrode and the pixel defining layer; and a second electrode disposed on the organic layer, wherein the second metal layer is disposed under the first conductive layer and has an undercut beneath the first conductive layer, wherein the organic layer is discontinuous between the partitioning walls, and wherein the partition walls include two partition walls disposed between two adjacent first electrodes, and the two partition walls respectively have undercuts on sides facing each other.

* * * * *